(12) United States Patent
Milton

(10) Patent No.: US 8,736,340 B2
(45) Date of Patent: May 27, 2014

(54) DIFFERENTIAL CLOCK SIGNAL GENERATOR

(75) Inventor: David W. Milton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/534,090

(22) Filed: Jun. 27, 2012

(65) Prior Publication Data

US 2014/0002167 A1   Jan. 2, 2014

(51) Int. Cl.
*G06F 1/10* (2006.01)
*G06F 1/06* (2006.01)

(52) U.S. Cl.
CPC .... *G06F 1/10* (2013.01); *G06F 1/06* (2013.01)
USPC .......................................... 327/295; 327/291

(58) Field of Classification Search
CPC ..................................... G06F 1/10; G06F 1/06
USPC .................................................. 327/291, 295
See application file for complete search history.

(56) References Cited

U.S. PATENT DOCUMENTS

| | | | |
|---|---|---|---|
| 5,903,747 A | 5/1999 | Casal | |
| 6,060,939 A | 5/2000 | Woeste et al. | |
| 6,329,861 B1 | 12/2001 | Francis | |
| 6,496,050 B2 * | 12/2002 | Lloyd | 327/407 |
| 6,507,230 B1 * | 1/2003 | Milton | 327/291 |
| 6,757,347 B1 | 6/2004 | Lo et al. | |
| 6,911,842 B1 | 6/2005 | Ghia et al. | |
| 7,102,446 B1 | 9/2006 | Lee et al. | |
| 7,116,147 B2 | 10/2006 | Kase | |
| 7,129,765 B2 | 10/2006 | Vadi et al. | |
| 7,240,266 B2 * | 7/2007 | Farmer et al. | 714/731 |
| 7,353,420 B2 | 4/2008 | Tsai | |
| 7,372,299 B2 | 5/2008 | Vadi et al. | |
| 7,412,618 B2 | 8/2008 | Ferraiolo et al. | |
| 7,456,674 B2 * | 11/2008 | Oakland | 327/291 |
| 7,996,807 B2 * | 8/2011 | Grise et al. | 716/126 |
| 2005/0225365 A1 | 10/2005 | Wood | |
| 2006/0184817 A1 | 8/2006 | Dreps et al. | |
| 2006/0190781 A1 * | 8/2006 | Farmer et al. | 714/724 |
| 2007/0001719 A1 | 1/2007 | Hulfachor et al. | |
| 2007/0200597 A1 * | 8/2007 | Oakland | 326/46 |
| 2008/0122515 A1 * | 5/2008 | Oakland | 327/291 |
| 2008/0147952 A1 | 6/2008 | Baumgartner et al. | |
| 2009/0153201 A1 | 6/2009 | Song | |
| 2009/0265677 A1 * | 10/2009 | Grise et al. | 716/12 |
| 2010/0118894 A1 | 5/2010 | Aweya et al. | |

OTHER PUBLICATIONS

PCT/US2013/044876, Jun. 10, 2013, IBM, International Search Report and Written Oipintion, Dec. 2, 2013, 8 pages.

* cited by examiner

*Primary Examiner* — Ryan Jager
(74) *Attorney, Agent, or Firm* — Gibb & Riley, LLC; David A. Cain, Esq.

(57) ABSTRACT

Disclosed is a differential clock signal generator which processes a first differential clock signal using a combination of differential and non-differential components to generate a second differential clock signal. Specifically, the first differential clock signal is converted into a single-ended clock signal, which is used either by a finite state machine to generate two single-ended control signals or by a waveform generator to generate a single-ended waveform control signal. In any case, a deskewer, which comprises a pair of single-ended latches and either multiplexer(s) or logic gates, processes the first differential clock signal, the single-ended clock signal, and the control signal(s) in order to output a second differential clock signal that is different from the first differential clock signal in terms of delay and, optionally, frequency, but synchronously linked to it.

14 Claims, 12 Drawing Sheets

DIFFERENTIAL CLOCK SIGNAL GENERATOR

BACKGROUND

1. Field of the Invention

The embodiments disclosed herein related to clock signal generation and, more particularly, to a differential clock signal generator having delay and, optionally, frequency adjusting and deskewing capabilities.

2. Description of the Related Art

Clock signal generators (also referred to as clock generation circuits) generate clock signals, which are used to precisely control the timing of digital logic circuits within an integrated circuit and, thereby to control the performance of the integrated circuit. A typical clock generator generates what is referred to in the art as a "single-ended" clock signal. A single-ended clock signal is carried on a wire and exhibits periodic transitions between a high voltage level and a low voltage level. The voltage on the wire at the receiving end is sensed and the transitions to low voltage and/or to high voltage the falling and/or rising edges of the received signal, respectively) are used as a reference to precisely control the timing of critical actions within digital circuits (e.g., to synchronize bus cycles or initiate data operations).

Oftentimes, different logic circuits within the same integrated circuit require clock signals having different frequencies (i.e., where the falling and rising edges occur more or less often). Thus, a number of different single-ended clock signal generators each with a frequency divider may be incorporated into an integrated circuit. Specifically, such single-ended clock signal generators receive a single-ended clock signal and output another single-ended clock signal having a different frequency than the input clock signal. For example, a clock signal generator may divide the frequency of a single-ended input clock signal by 1, by 2, by 3, etc. Unfortunately, when such a clock signal generator is used, a difference in delay time may occur among the various clock signals operating within the integrated circuit. This difference in delay time is known as clock skew and can negatively impact performance. More specifically, edges of different clock signals within an integrated circuit should be synchronously timed. For example, if an output clock signal is a divide-by-2 signal of an input clock signal, every other edge of the input clock signal should be aligned with an edge on the output clock signal. If they are not, the difference is referred to as skew and this skew can negatively impact performance. Thus, various embodiments of a single-ended clock signal generator that performs a combination of frequency dividing and deskewing processes have been developed (e.g., see U.S. Pat. No. 6,507,230 of Milton issued on Jan. 14, 2003, assigned to International Business Machines, Corp. of Armonk, N.Y. and incorporated herein by reference).

The above-described single-ended clock signal generators are suitable for the purposes for which they were designed. However, since timing is based on the voltage level of the wire carrying the single-ended clock signal, the performance of digital circuits that employ single ended clock signals is sensitive to voltage variations. Therefore, to overcome the voltage-sensitivity issues related to single-ended clock signals, differential clock signals have been developed.

For a differential clock signal, two wires form a loop between a transmitting end and a receiving end such that the current flowing through the two wires is equal but in opposite directions. An input signal is driven across both wires such that it is 180 degrees out of phase. The voltage difference between the two wires at the receiving end is determined and, more particularly, the polarity of the voltage difference is determined and the transitions to negative polarity and/or positive polarity (i.e., the falling and/or rising edges of the received signal, respectively) are used as a reference to precisely control the timing of critical actions within digital circuits (e.g., to synchronize bus cycles or initiate data operations). As long as the two wires are tightly electromagnetic coupled, the differential clock signal is less sensitive to noise. Furthermore, since timing is based on the polarity of the voltage difference between the two wires carrying the differential clock signal and not the voltage levels on the wires themselves, the performance of digital circuits that employ differential clock signals is not sensitive to voltage variations.

As mentioned above, different logic circuits within the same integrated circuit require clock signals having different frequencies (i.e., where the falling and rising edges occur more or less often). Generating differential clock signals with different frequencies is typically achieved by first converting a differential clock signal into a single-ended clock signal. Then, the single-ended clock signal is input into a single-ended clock signal generator, such as that described above, which performs a combination of frequency dividing and deskewing processes in order to output another single-ended clock signal. The output of the single-ended clock signal generator is then converted back into a differential clock signal. Unfortunately, processing in this manner makes the signal more susceptible to noise and power variation such that the advantages of using the differential clock signal in the first place are lost.

SUMMARY

In view of the foregoing, disclosed herein are embodiments of a differential clock signal generator which processes a first differential clock signal using a combination of both differential and non-differential components to generate a second differential clock signal. Specifically, a signal converter converts the first differential clock signal into a single-ended clock signal. The single-ended clock signal is used either by a finite state machine to generate two single-ended control signals or by a waveform generator to generate a single-ended waveform control signal. In any case, a deskewer, which comprises a pair of single-ended latches and either multiplexer(s) or logic gates, receives and processes the first differential clock signal, the single-ended clock signal, and the control signal(s) in order to output a second differential clock signal such that the second differential clock signal is different from the first differential clock signal (e.g., in terms of delay and, optionally frequency), but synchronously linked to the first differential clock signal (i.e., the rising and falling edges of the second differential clock signal will occur coincident with rising and/or falling edges of the first differential clock signal). Since the path from the first differential clock signal to the second different clock signal is entirely within the differential domain, the resulting second differential clock signal is less susceptible to noise and power variation. Additionally, there is less uncertainty with regard to the second differential clock signal because the clock latency is smaller.

More particularly, disclosed herein are embodiments of a differential clock signal generator that comprises a signal converter, a finite state machine and a deskewer.

In each of the embodiments, the signal converter can convert a first differential clock signal into a single-ended clock signal. The finite state machine can receive the single-ended clock signal and, based on the single-ended clock signal and a set of signal adjustment parameters, can output two single-ended control signals (i.e., a first single-ended control signal and a second single-ended control signal different from the first single-ended control signal). Then, the deskewer can receive the first differential clock signal, the single-ended clock signal, and the two single-ended control signals and, based on all of these signals, can output a second differential clock signal that is different from the first differential clock signal (e.g., in terms of delay and, optionally, frequency), but synchronously linked to the first differential clock signal (i.e., the rising and falling edges of the second differential clock signal will occur coincident with rising and/or falling edges of the first differential clock signal).

In one embodiment, the deskewer can comprise a single-ended signal inverter, a first latch, a second latch and a single multiplexer. In this embodiment, the single-ended signal inverter can invert the single-ended clock signal in order to output an inverted single-ended clock signal. The first latch can sample the first single-ended control signal by the inverted single-ended clock signal in order to output a first single-ended sampled signal. The second latch can sample the second single-ended control signal with the single-ended clock signal in order to output a second single-ended sampled signal. Finally, the single multiplexer can receive a select signal comprising the first differential clock signal, can receive single-ended data input signals comprising the first single-ended sampled signal from the first latch and the second single-ended sampled signal from the second latch, and can output a differential data output signal and, more particularly, the second differential clock signal.

In another embodiment, the deskewer can comprise a single-ended signal inverter, a first latch, a second latch and multiple multiplexers. In this embodiment, like the previously described embodiment, the single-ended signal inverter can invert the single-ended clock signal in order to output an inverted single-ended clock signal, the first latch can sample the first single-ended control signal by the inverted single-ended clock signal to output a first single-ended sampled signal and the second latch can sample the second single-ended control signal by the single-ended clock signal in order to output a second single-ended sampled signal. However, instead of a single multiplexer with the single-ended sampled signals as data input signals and the first differential clock signal as a select signal, multiple multiplexers, which have differential data input and output signals and single-ended select signals, can be used. Specifically, the multiple multiplexers can comprise a first multiplexer and a second multiplexer connected in parallel to a third multiplexer. The first multiplexer and the second multiplexer can each receive the second single-ended sampled signal from the second latch as select signals (i.e., as a first select signal and a second select signal, respectively) and the third multiplexer can receive the first single-ended sampled signal from the first latch as a third select signal. Additionally, at least the first multiplexer can receive a differential data input signal comprising the first differential clock signal and the third multiplexer can output a differential data output signal and, more particularly, the second differential clock signal.

In yet another embodiment, the deskewer can comprise a single-ended signal inverter, a first latch, a second latch and multiple logic gates. In this embodiment, like the previously described embodiments, the single-ended signal inverter can invert the single-ended clock signal in order to output an inverted single-ended clock signal, the first latch can sample the first single-ended control signal by the inverted single-ended clock signal in order to output a first single-ended sampled signal and the second latch can sample the second single-ended control signal by the single-ended clock signal in order to output a second single-ended sampled signal. However, instead of multiplexer(s), multiple logic gates, which have a combination of differential and single-ended data input signals, can be used.

Specifically, these multiple logic gates can comprise at least a first AND gate, a second AND gate, a third AND gate and either an OR gate or a fourth AND gate. The first AND gate can receive first data input signals comprising the first single-ended sampled signal from the first latch and the first differential clock signal and can output a first differential data output signal. At a differential signal crossover point, the wires of the first differential clock signal can be crossed over in order to achieve an inverted differential clock signal. The second AND gate can receive second data input signals comprising the second single-ended sampled signal from the second latch and the inverted differential clock signal and can output a second differential data output signal. The third AND gate can receive third data input signals comprising the first single-ended sampled signal from the first latch and the second single-ended sampled signal from the second latch and can output a single-ended data output signal. An OR gate can receive fourth data input signals comprising the first differential data output signal from the first AND gate, the second differential data output signal from the second AND gate and the single-ended data output signal from the third AND gate and can output a third differential data output signal and, more particularly, the second differential clock signal.

Alternatively, instead of an OR gate, a fourth AND gate can be used. In this case, at a second differential signal crossover point the wires of the first differential data output signal from the first AND gate can be crossed over in order to achieve an inverted first differential data output signal. At a third differential signal crossover point the wires of the second differential data output signal from the second AND gate can be crossed over in order to achieve an inverted second differential data output signal. A second single-ended signal inverter can invert the single-ended data output signal from the third AND gate and can output an inverted single-ended data output signal. A fourth AND gate can receive fourth data input signals comprising the inverted first differential data output signal, the inverted second differential data output signal and the inverted single-ended data output signal and can output a third differential data output signal. Finally, at a fourth differential signal crossover point the wires of the third differential data output signal can be crossed over in order in order to achieve an inverted third differential data output signal and, more particularly, the second differential clock signal.

Also disclosed herein are embodiments of a differential clock signal generator comprising a signal converter, a waveform generator and a deskewer.

In each of these embodiments, the signal converter can convert a first differential clock signal into a single-ended clock signal. The waveform generator can receive the single-ended clock signal and, based on the single-ended clock signal and a set of signal adjustment parameters, can output a single-ended waveform control signal. Finally, a deskewer can receive the first differential clock signal, the single-ended clock signal, and the single-ended waveform control signal and, based on all of these signals, can output a second differential clock signal that is different from the first differential clock signal (e.g., in terms of delay and, optionally, frequency), but synchronously linked to the first differential clock signal (i.e., the rising and falling edges of the second differential clock signal will occur coincident with rising and/or falling edges of the first differential clock signal).

In one embodiment, the deskewer can comprise a single-ended signal inverter, a first latch, a second latch and a single multiplexer. In this embodiment, the single-ended signal inverter can invert the single-ended clock signal in order to output an inverted single-ended clock signal. The first latch can sample the single-ended waveform control signal by the inverted single-ended clock signal in order to output a first single-ended sampled signal. The second latch can sample the single-ended waveform control signal by the single-ended clock signal in order to output a second single-ended sampled signal. Finally, the single multiplexer can receive a select signal comprising the first differential clock signal, can receive single-ended data input signals comprising the first single-ended sampled signal from the first latch and the second single-ended sampled signal from the second latch, and can output a differential data output signal and, more particularly, the second differential clock signal.

In another embodiment, the deskewer can comprise a single-ended signal inverter, a first latch, a second latch and multiple multiplexers. In this embodiment, like the previously described embodiment, the single-ended signal inverter can invert the single-ended clock signal in order to output an inverted single-ended clock signal, the first latch can sample the single-ended waveform control signal by the inverted single-ended clock signal in order to output a first single-ended sampled signal and the second latch can sample the single-ended waveform control signal by the single-ended clock signal in order to output a second single-ended sampled signal. However, instead of a single multiplexer with the single-ended sampled signals from the first and second latches as data input signals and the first differential clock signal as a select signal, in this embodiment, multiple multiplexers, which have differential data input and output signals and single-ended select signals, can be used. Specifically, the multiple multiplexers can comprise a first multiplexer and a second multiplexer connected in parallel to a third multiplexer. The first multiplexer and the second multiplexer can each receive the second single-ended sampled signal from the second latch as select signals (i.e., as a first select signal and a second select signal, respectively) and the third multiplexer can receive the first single-ended sampled signal from the first latch as a third select signal. Additionally, at least the first multiplexer can receive a differential data input signal comprising the first differential clock signal and the third multiplexer can output a differential data output signal and, more particularly, the second differential clock signal.

In yet another embodiment, the deskewer can comprise a single-ended signal inverter, a first latch, a second latch and multiple logic gates. In this embodiment, like the previously described embodiments, the single-ended signal inverter can invert the single-ended clock signal in order to output an inverted single-ended clock signal, the first latch can sample the single-ended waveform control signal by the inverted single-ended clock signal in order to output a first single-ended sampled signal and the second latch can sample the single-ended waveform control signal by the single-ended clock signal in order to output a second single-ended sampled signal. However, instead of multiplexer(s), multiple gates, which receive a combination of differential and single-ended data input signals, can be used. Specifically, these multiple logic gates can comprise at least a first AND gate, a second AND gate, a third AND gate and either an OR gate or a fourth AND gate. The first AND gate can receive first data input signals comprising the first single-ended sampled signal from the first latch and the first differential clock signal and can output a first differential data output signal. At a differential signal crossover point the wires of the first differential clock signal can be crossed over in order to achieve an inverted differential clock signal. The second AND gate can receive second data input signals comprising the second single-ended sampled signal from the second latch and the inverted differential clock signal and can output a second differential data output signal. The third AND gate can receive third data input signals comprising the first single-ended sampled signal from the first latch and the second single-ended sampled signal from the second latch and can output a single-ended data output signal. An OR gate can receive fourth data input signals comprising the first differential data output signal from the first AND gate, the second differential data output signal from the second AND gate and the single-ended data output signal from the third AND gate and can output a third differential data output signal and, more particularly, the second differential clock signal.

Alternatively, instead of an OR gate, a fourth AND gate can be used. In this case, at a second differential signal crossover point the wires of the first differential data output signal from the first AND gate can be crossed over in order to achieve an inverted first differential data output signal. At a third differential signal crossover point the second differential data output signal from the second AND gate can be crossed over in order to achieve an inverted second differential data output signal. A second single-ended signal inverter can invert the single-ended data output signal from the third AND gate and can output an inverted single-ended data output signal. A fourth AND gate can receive fourth data input signals comprising the inverted first differential data output signal, the inverted second differential data output signal and the inverted single-ended data output signal and can output a third differential data output signal. Finally, at a fourth differential signal crossover point the wires of the third differential data output signal can be crossed over in order to achieve an inverted third differential data output signal and, more particularly, the second differential clock signal.

BRIEF DESCRIPTION OF THE DRAWINGS

The embodiments disclosed herein will be better understood from the detailed description with reference to the following drawings, which are not necessarily drawn to scale and in which.

DETAILED DESCRIPTION

As mentioned above, generating differential clock signals with different frequencies is typically achieved by first converting a differential clock signal into a single-ended clock signal. Then, the single-ended clock signal is input into a single-ended clock signal generator, such as that described above, which performs a combination of frequency dividing and deskewing processes in order to output another single-ended clock signal. The output of the single-ended clock signal generator is then converted back into a differential clock signal. Unfortunately, processing in this manner makes the signal more susceptible to noise and power variation such that the advantages of using the differential clock signal in the first place are lost.

In view of the foregoing, disclosed herein are embodiments of a differential clock signal generator which processes a first differential clock signal using a combination of both differential and non-differential components to generate a second differential clock signal. Specifically, a signal converter converts the first differential clock signal into a single-ended clock signal. The single-ended clock signal is used either by a finite state machine to generate two single-ended control signals or by a waveform generator to generate a single-ended waveform control signal. In any case, a deskewer, which comprises a pair of single-ended latches and either multiplexer(s) or logic gates, receives and processes the first differential clock signal, the single-ended clock signal, and the control signal(s) in order to output a second differential clock signal that is different from the first differential clock signal (e.g., in terms of delay and, optionally, frequency), but synchronously linked to the first differential clock signal (i.e., the rising and falling edges of the second differential clock signal will occur coincident with rising and/or falling edges of the first differential clock signal). Since the path from the first differential clock signal to the second differential clock signal is entirely within the differential domain, the resulting second differential clock signal is less susceptible to noise and power variation. Additionally, there is less uncertainty with regard to the second differential clock signal because the clock latency is smaller.

Figure 1A:
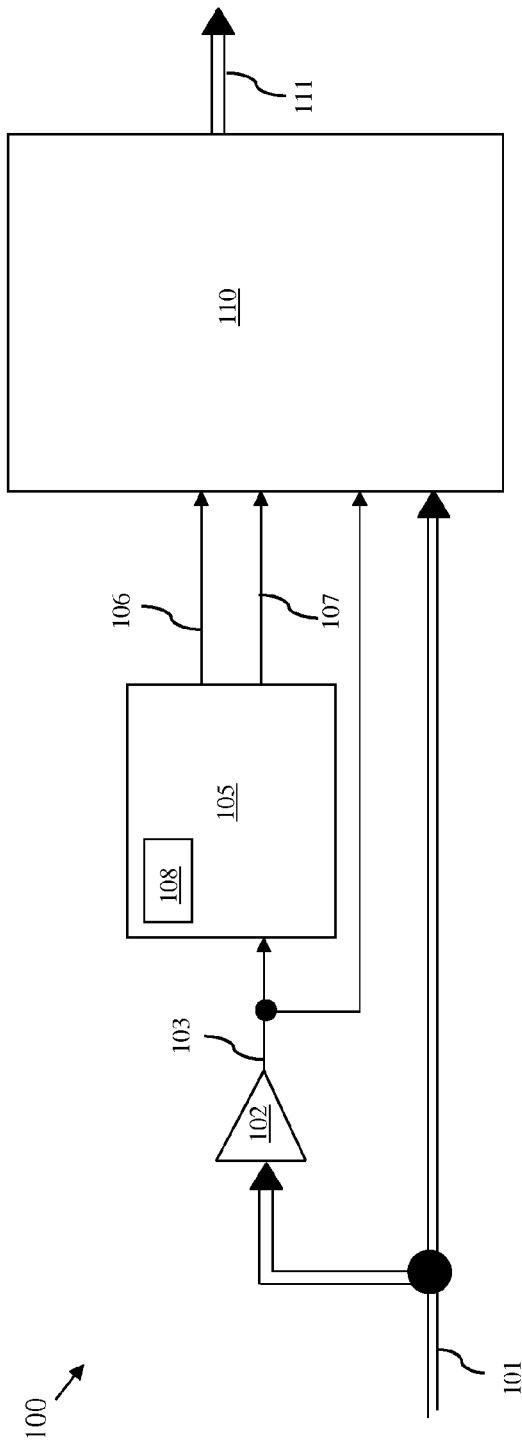
FIG. 1A is a schematic diagram illustrating embodiments of a differential clock signal generator.

More particularly, referring to FIG. 1A, disclosed herein are embodiments of a differential clock signal generator 100 that comprises a signal converter 102, a finite state machine 105 and a deskewer 110.

In each of the embodiments, the signal converter 102 can convert (i.e., can be adapted to convert, configured to convert, etc.) a first differential clock signal 101 into a single-ended clock signal 103.

The finite state machine 105 can receive the single-ended clock signal 103 and can process (i.e., can be adapted to process, configured to process, programmed to process, etc.) the single-ended clock signal 103 based on a previously established and stored set 108 of signal adjustment parameters in order to output two single-ended control signals (i.e., a first single-ended control signal 106 and a second single-ended control signal 107 different from the first single-ended control signal). More specifically, the set of signal adjustment parameters 108 can specify an optional signal frequency adjustment (e.g., frequency division) and the finite state machine 105 can process the single-ended clock signal 103 based on these parameters to output a pair of single-ended control signals 106, 107. These single-ended control signals 106, 107 will, as discussed in greater detail below, be subsequently processed by the deskewer 110 in order to output a second differential clock signal 111 and achieve a signal delay, which is fixed as a function of the deskewer 110 structure, and any desired frequency adjustment (e.g., frequency division).

The finite state machine 105 can comprise, for example, a finite state machine, such as that described in detail in U.S. Pat. No. 6,507,230 incorporated by reference above, which can operate at a 1X clock frequency to separately encode information on two different control signal outputs 106, 107 in order to propagate one or two clock edges for every clock cycle. More specifically, for every clock cycle of the single-ended clock signal 103, the finite state machine 105 can generate (i.e., can be adapted to generate, can be configured to generate, etc.) two values on the single-ended control signals 106 and 107. The control signal 106 can yield a value of the first half of a clock cycle, and the control signal 107 can yield a value of the second half of the same clock cycle, or vice versa. The values of the control signals 106, 107 may be different in each clock cycle.

The deskewer 110 can receive the first differential clock signal 101, the single-ended clock signal 103, and the two single-ended control signals 106, 107 and, based on all of these signals 101, 103, 106 and 107, can output a second differential clock signal 111 that is different from, but essentially synchronously timed with, the first differential clock signal 101. That is, the deskewer 110 can process these signals 101, 103, 106 and 107 such that the second differential clock signal 111 will be delayed with respect to the first differential clock signal 101 and will further, optionally, have a different frequency than the first differential clock signal 101.

For example, the deskewer 110 can process these signals 101, 103, 106 and 107 such that the first differential clock signal 101 has a first frequency and the second differential clock signal 111 has a second frequency that is equal to the first frequency divided by n, where n is a number, as specified in the set of signal adjustment parameters 108. This number n can, for example, be 1, when the signal adjustment required is a signal delay and not a frequency adjustment. This number n can, for example, be 1.5, 2, 2.5, 3, 3.5, 4, 4.5, and so on, when the frequency adjustment required is a simple frequency division. Alternatively, more complex formulas can be used when the desired frequency adjustment is more complex (e.g., when the frequency level of the second differential clock signal 111 is required to alternate over time).

Furthermore, the deskewer 110 can process these signals 101, 103, 106 and 107 such that even though the first and second differential clock signals 101 and 111 are different in terms of delay and, optionally, frequency, the second differential clock signal 111 has edges (e.g., rising or falling edges) that are essentially synchronously timed with (i.e., essentially coincident with) edges of the first differential clock signal 111. In other words, the deskewer 110 can process these signals 101, 103, 106 and 107 such that every one of the edges, rising and falling, of the second differential clock signal 111, which is output by the deskewer 110, is coincident with some edge, rising or falling, of the first differential clock signal 101.

Figure 1B:
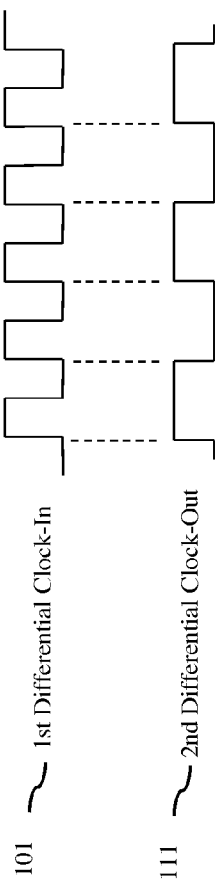
FIG. 1B is a timing diagram illustrating an exemplary differential clock signal input into the differential clock signal generator of FIG. 1A and an exemplary differential clock signal output from the differential clock signal generator of FIG. 1A.

For example, as illustrated in the timing diagram of FIG. 1B, if the signal adjustment parameters provide for a divide-by-2 function such that the frequency of the second differential clock signal 111 is one-half that of the first differential clock signal 101, then every edge, rising and falling, of the second differential clock signal 111 may be essentially synchronously time with (i.e., will occur coincident with) every other edge (e.g., every rising edge) of the first differential clock signal 101.

Figure 2:
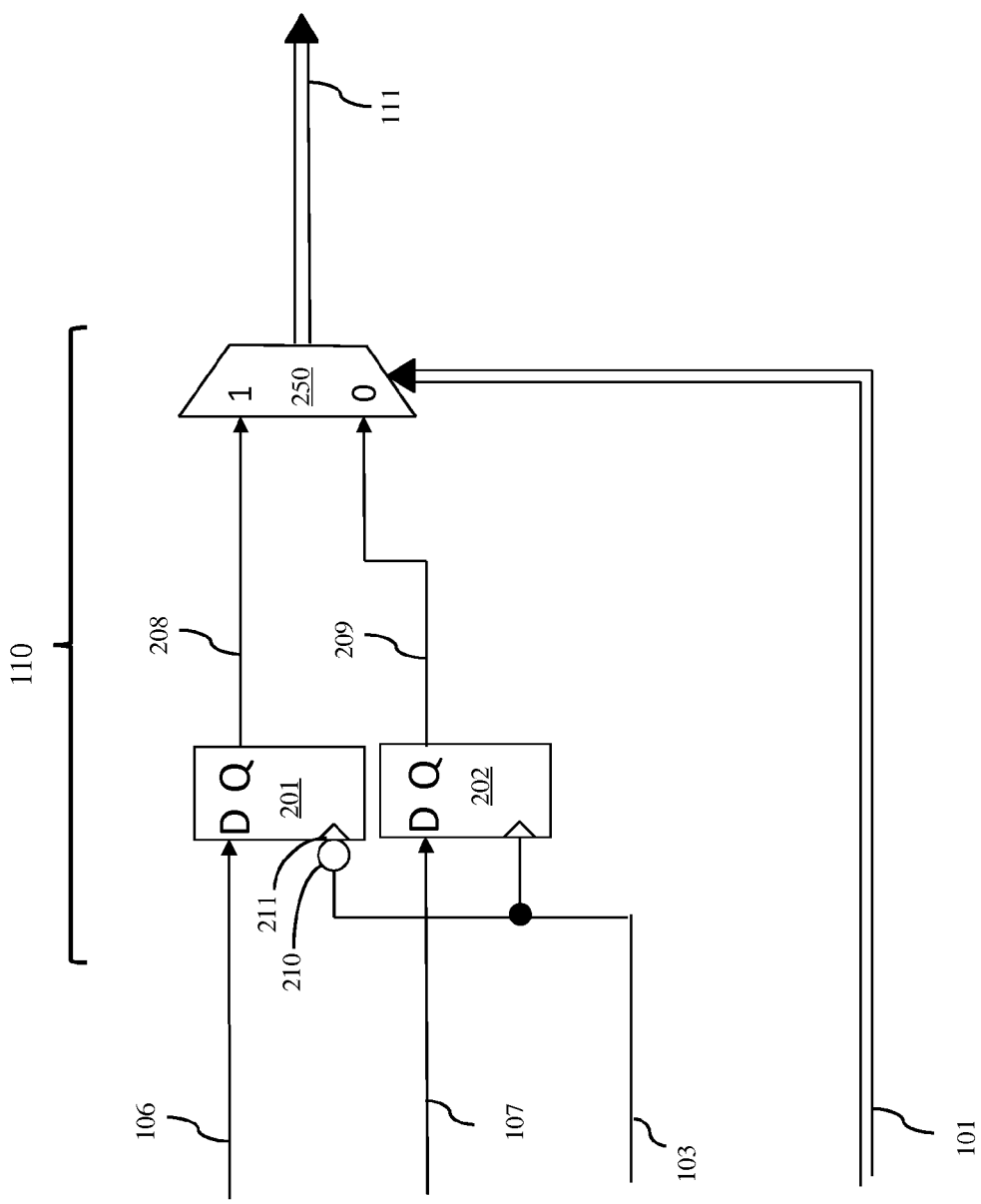
FIG. 2 is a schematic diagram illustrating an exemplary deskewer that can be incorporated into the differential clock signal generator of FIG. 1A.

Referring to FIG. 2, in one embodiment the deskewer 110 of the differential clock signal generator 100 of FIG. 1 can comprise a single-ended signal inverter 210, a pair of latches (e.g., a first latch 201 and a second latch 202) and a single multiplexer 250.

In this embodiment, the single-ended signal inverter 210 can receive and can invert (i.e., can be adapted to invert, configured to invert, etc.) the single-ended clock signal 103 in order to output an inverted single-ended clock signal 211.

The latches 201, 202 can each comprise, for example, D-latches (also referred to herein as edge triggered latches). The first latch 201 can sample the first single-ended control signal 106, which functions as the data input signal for this latch 201, by the inverted single-ended clock signal 211, which functions as the clock signal for this latch 201, in order to output a first single-ended sampled signal 208. The second latch 202 can sample the second single-ended control signal 107, which functions as the data input signal for this latch 202, by the single-ended clock signal 103, which functions as the clock signal for this latch 202, in order to output a second single-ended sampled signal 209.

Finally, the single multiplexer 250 can comprise a two single-ended input multiplexer with a differential select. Specifically, the single multiplexer 250 can receive a select signal comprising the first differential clock signal 101, can receive single-ended data input signals comprising the first sampled signal 208 from the first latch 201 and the second sampled signal 209 from the second latch 202, and can process theses signals (i.e., can be adapted to process these signals, configured to process these signals, etc.) in order to output a differential data output signal and, more particularly, the second differential clock signal 111. Those skilled in the art will recognize that a two input multiplexer is generally configured two select from two data input signals and based on the state of the select signal. In this case, the multiplexer 250 can further incorporate a signal converter that converts (i.e., is adapted to convert, configured to convert, etc.) the selected data input signal into a differential data output signal.

Figure 3:
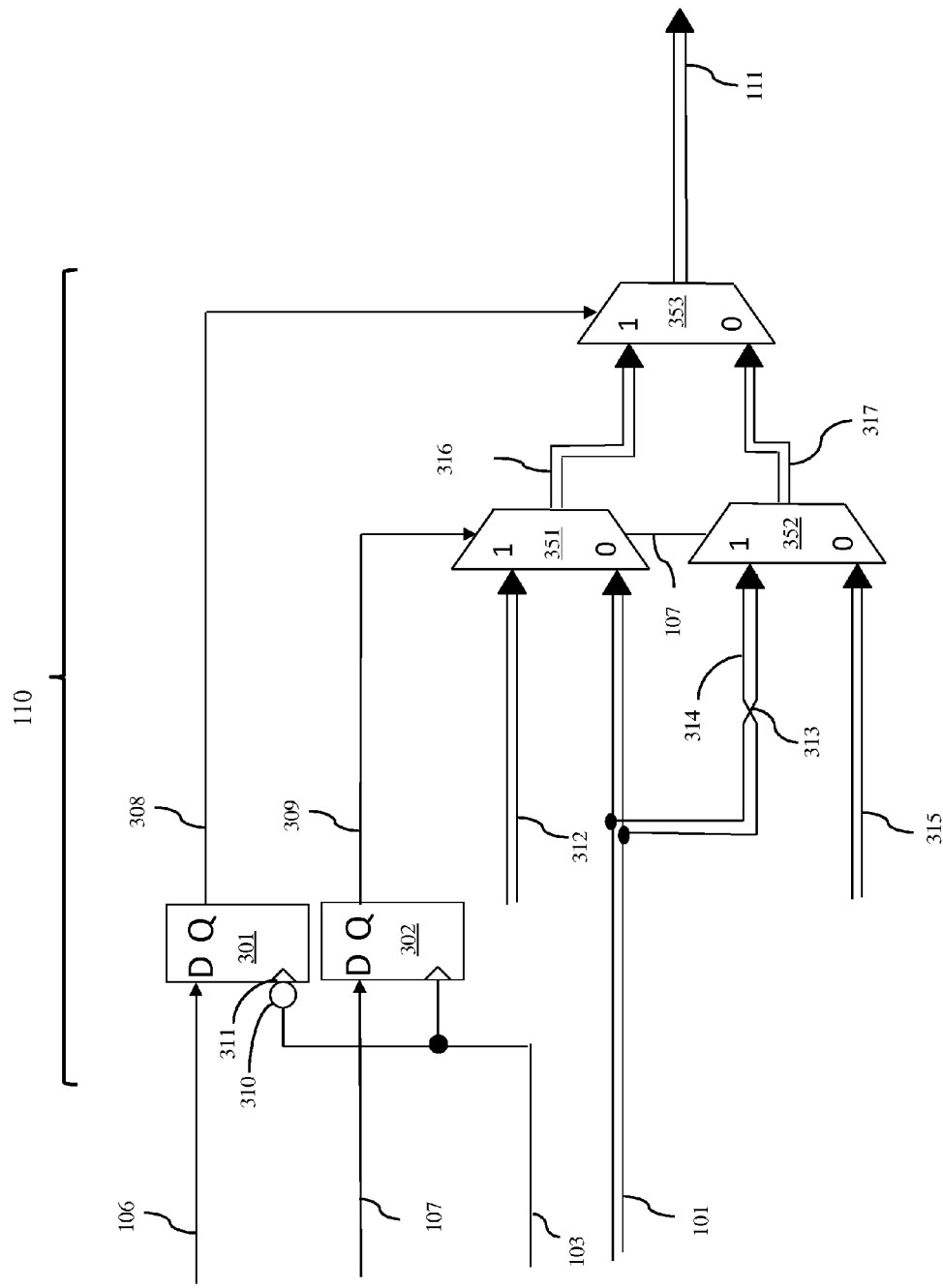
FIG. 3 is a schematic diagram illustrating another exemplary deskewer that can be incorporated into the differential clock signal generator of FIG. 1A.

Referring to FIG. 3, in another embodiment the deskewer 110 of the differential clock signal generator 100 of FIG. 1 can comprise a single-ended signal inverter 310, a pair of latches (e.g., a first latch 301 and a second latch 302) and multiple multiplexers 351-353. In this embodiment, like the previously described embodiment, the single-ended signal inverter 310 can invert the single-ended clock signal 103 in order to output an inverted single-ended clock signal 311. Additionally, the latches 301, 302 can each comprise, for example, D-latches (also referred to herein as edge triggered latches). The first latch 301 can sample the first single-ended control signal 106, which functions as the data input signal for this latch 301, by the inverted single-ended clock signal 311, which functions as the clock signal for this latch 301, in order to output a first single-ended sampled signal 308. The second latch 302 can sample the second single-ended control signal 107, which functions as the data input signal for this latch 302, by the single-ended clock signal 103, which functions as the clock signal for this latch 302, in order to output a second single-ended sampled signal 309. However, instead of a single multiplexer with the single-ended sampled signals as data input signals and the first differential clock signal as a select signal, in this embodiment, multiple multiplexers 351-353, which have differential data input and output signals and single-ended select signals, can be used.

Specifically, the multiple multiplexers can comprise a first multiplexer 351 and a second multiplexer 352 connected in parallel to a third multiplexer 353. The first multiplexer 351 and the second multiplexer 352 can each receive the second single-ended sampled signal 309 as from the second latch 302 as their select signals (i.e., as a first select signal for the first multiplexer 351 and as a second select signal for the second multiplexer 352) and the third multiplexer 353 can receive the first single-ended sampled signal 308 from the first latch 301 as its select signal (i.e., as a third select signal). Additionally, the first multiplexer 351 can receive a differential high reference signal 312 and the first differential clock signal 101 as its first differential data input signals and can process those signals (i.e., can be adapted to process those signals, configured to process those signals, etc.) in order to output a first differential data output signal 316. The differential high reference signal 312 will be tied high.

At a differential signal crossover point 313 the wires carrying the differential clock signal 101 are crossed over (i.e., swapped) in order to achieve an inverted differential clock signal 314. The second multiplexer 351 can receive second differential data input signals comprising the inverted differential clock signal 314 and a differential low reference signal 315 and can process those signals (i.e., can be adapted to process those signals, configured to process those signals, etc.) in order to output a second differential data output signal 317. The differential low reference signal 312 will be tied low.

Finally, the third multiplexer 353 can receive third differential data input signals comprising the first differential data output signal 316 from the first multiplexer 351 and the second differential data output signal 317 from the second multiplexer 352 and can process those signals (i.e., can be adapted to process those signals, configured to process those signals, etc.) in order to output a third differential data output signal and, more particularly, the second differential clock signal 111.

Figure 4:
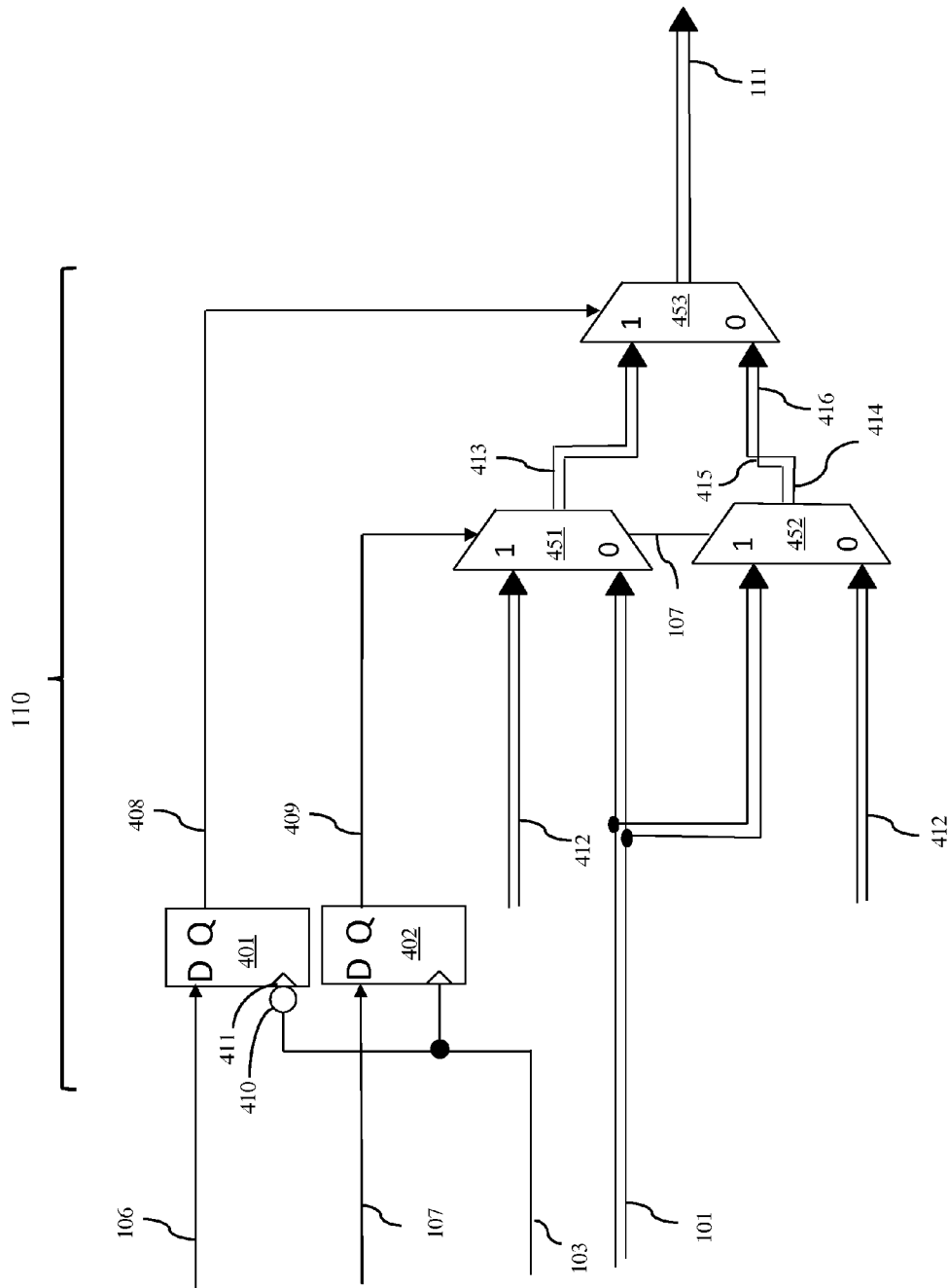
FIG. 4 is a schematic diagram illustrating yet another exemplary deskewer that can be incorporated into the differential clock signal generator of FIG. 1A.

Referring to FIG. 4, in another embodiment the deskewer 110 of the differential clock signal generator 100 of FIG. 1 can comprise a single-ended signal inverter 410, a pair of latches (e.g., a first latch 401 and a second latch 402) and multiple multiplexers 451-453. In this embodiment, like the previously described embodiments, the single-ended signal inverter 410 can invert the single-ended clock signal 103 in order to output an inverted single-ended clock signal 411. Additionally, the latches 401, 402 can each comprise, for example, D-latches (also referred to herein as edge triggered latches). The first latch 401 can sample the first single-ended control signal 106, which functions as the data input signal for this latch 401, by the inverted single-ended clock signal 411, which functions as the clock signal for this latch 401, in order to output a first single-ended sampled signal 408. The second latch 402 can sample the second single-ended control signal 107, which functions as the data input signal for this latch 402, by the single-ended clock signal 103, which functions as the clock signal for this latch 402, in order to output a second single-ended sampled signal 409. Again, instead of a single multiplexer with the single-ended sampled signals as data input signals and the first differential clock signal as a select signal, in this embodiment, multiple multiplexers 451-453, which have differential data input and output signals and single-ended select signals, can be used.

In this case, the multiple multiplexers can comprise a first multiplexer 451 and a second multiplexer 452 connected in parallel to a third multiplexer 453. The first multiplexer 451 and the second multiplexer 452 can each receive the second single-ended sampled signal 409 from the second latch 402 as their select signals (i.e., as a first select signal for the first multiplexer 451 and a second select signal for the second multiplexer 452) and the third multiplexer 453 can receive the first single-ended sampled signal 408 from the first latch 401 as its third select signal. Additionally, the first multiplexer 451 can receive first differential data input signals comprising a differential high reference signal 412 and the first differential clock signal 101 and can process those signals (i.e., can be adapted to process those signals, can be configured to process those signals, etc.) in order to output a first differential data output signal 413. The differential high reference signal 412 will be tied high.

The second multiplexer 452 can receive second differential data input signals similarly comprising the first differential clock signal 101 and the differential high reference signal 412 and can process those signals (i.e., can be adapted to process those signals, configured to process those signals, etc.) in order to output a second differential data output signal 414. At a differential signal crossover point 415 the wires carrying the second differential data output signal 414 can be crossed over (i.e., swapped) in order to achieve an inverted second differential data output signal 416.

Finally, the third multiplexer 453 can receive third differential data input signals comprising the first differential data output signal 413 from the first multiplexer 451 and the inverted second differential data output signal 416 from the differential signal crossover point 415 and can process those signals (i.e., can be adapted to process those signals, configured to process those signals, etc.) in order to output a third differential data output signal and, more particularly, the second differential clock signal 111.

It should be noted that in the embodiments illustrated in FIGS. 3 and 4 described in detail above the multiplexers must be capable of operating relatively fast. If the select signal of any one of the multiplexers changes while both inputs are in the same state and the output has settled, then there must be no activity on the output. Additionally, the single-ended clock signal 103 must be sufficiently aligned with the differential clock signal 101 in order to meet a ½ cycle clock-gating setup/hold times within the multiplexers, so there is no timing arc from a multiplexer select to its output. This will be true because, providing setup/hold at the multiplexer has been met, the multiplexer select will change only when both data inputs to the multiplexer are the same. Additionally, as with mentioned above, an appropriate finite state machine 105 for incorporation into this differential clock signal generator 100 should have the capability to generate an output clock whose rising and falling edges can be placed anywhere you like, with ½ clock cycle resolution. Specifically, referring for example to FIG. 3, the single-ended clock signal 103 and a True half of the differential clock should be coincident (subject to skew limitations). Then, the first single-ended control signal 106 can encode what the output True clock (see the first differential data output signal 316) will be (1 or 0) while the input True clock is high, and the second single-ended control signal 107 can encode what the output True clock will be (1 or 0) while the input True clock is low. Of course, the output False clock (see second differential data output signal 317) will always the compliment of the output True clock 316.

Figure 5:
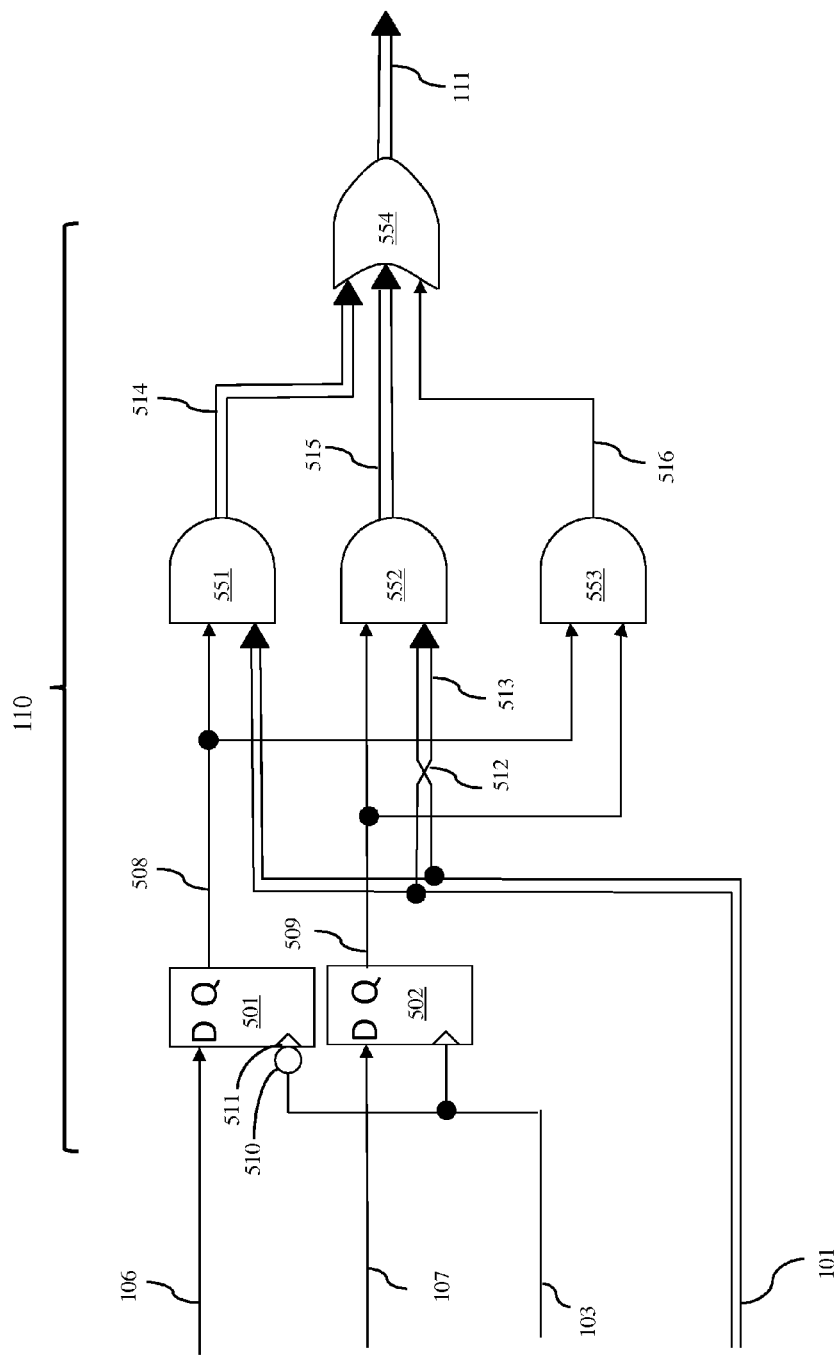
FIG. 5 is a schematic diagram illustrating yet another exemplary deskewer that can be incorporated into the differential clock signal generator of FIG. 1A.

Referring to FIG. 5, in yet another embodiment the deskewer 110 of the differential clock signal generator 100 of FIG. 1 can comprise a single-ended signal inverter 510, a pair of latches (e.g., a first latch 501 and a second latch 502) and multiple logic gates. In this embodiment, like the previously described embodiments, the single-ended signal inverter 510 can invert the single-ended clock signal 103 in order to output an inverted single-ended clock signal 511. Additionally, the latches 501, 502 can each comprise, for example, D-latches (also referred to herein as edge triggered latches). The first latch 501 can sample the first single-ended control signal 106, which functions as the data input signal for this latch 501, by the inverted single-ended clock signal 511, which functions as the clock signal for this latch 501, in order to output a first sampled signal 508. The second latch 502 can sample the second single-ended control signal 107, which functions as the data input signal for this latch 502, by the single-ended clock signal 103, which functions as the clock signal for this latch 502, in order to output a second sampled signal 509. However, instead of multiplexer(s), multiple gates, which receive a combination of differential and single-ended data input signals, can be used. These multiple logic gates can comprise at least three AND gates, and an OR gate to which the three AND gates are electrically connected in parallel.

Specifically, the multiple logic gates can comprise a first AND gate 551, a second AND gate 552, a third AND gate 553 and an OR gate 554. The first AND gate 551 can receive first data input signals comprising the first single-ended sample signal 508 from the first latch 501 and the first differential clock signal 101 and can process those signals (i.e., can be adapted to process those signals, can be configured to process those signals, etc.) in order to output a first differential data output signal 514. At a differential signal crossover point 512 the wires of the first differential clock signal 101 can be crossed over (i.e., swapped) in order to achieve an inverted differential clock signal 513. The second AND gate 552 can receive second data input signals comprising the second single-ended sampled signal 509 from the second latch 502 and the inverted differential clock signal 513 and can process those signals (i.e., can be adapted to process those signals, configured to process those signals, etc.) in order to output a second differential data output signal 515. The third AND gate 553 can receive third data input signals comprising the first single-ended sampled signal 508 from the first latch 501 and the second single-ended sampled signal 509 from the second latch 502 and can process those signals (i.e., can be adapted to process those signals, configured to process those signals, etc.) in order to output a single-ended data output signal 516. The OR gate 554 can receive fourth data input signals comprising the first differential data output signal 514 from the first AND gate 551, the second differential data output signal 515 from the second AND gate 552 and the single-ended data output signal 516 from the third AND gate 553 and can process those signals (i.e., can be adapted to process those signals, configured to process those signals, etc.) in order to output a third differential data output signal and, more particularly, the second differential clock signal 111.

Figure 6:
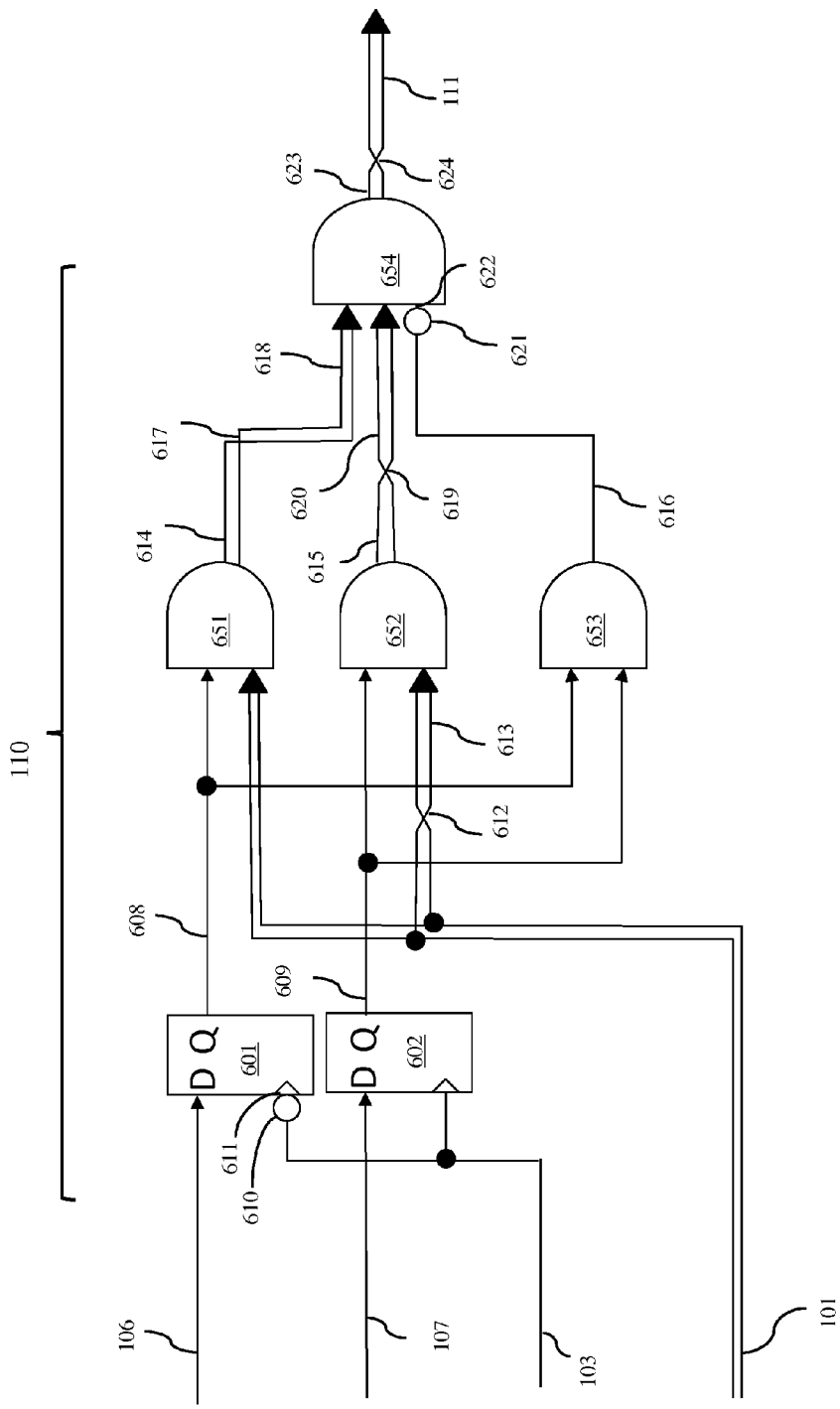
FIG. 6 is a schematic diagram illustrating yet another exemplary deskewer that can be incorporated into the differential clock signal generator of FIG. 1A.

Referring to FIG. 6, in yet another embodiment the deskewer 110 of the differential clock signal generator 100 of FIG. 1 can comprise a single-ended signal inverter 610, a pair of latches (e.g., a first latch 601 and a second latch 602) and multiple logic gates. In this embodiment, like the previously described embodiments, the single-ended signal inverter 610 can invert the single-ended clock signal 103 in order to output an inverted single-ended clock signal 611. Additionally, the latches 601, 602 can each comprise, for example, D-latches (also referred to herein as edge triggered latches). The first latch 601 can sample the first single-ended control signal 106, which functions as the data input signal for this latch 601, by the inverted single-ended clock signal 611, which functions as the clock signal for this latch 601, in order to output a first single-ended sampled signal 608. The second latch 602 can sample the second single-ended control signal 107, which functions as the data input signal for this latch 602, with the single-ended clock signal 103, which functions as the clock signal for this latch 602, in order to output a second single-ended sampled signal 609. However, instead of multiplexer(s), multiple gates, which receive a combination of differential and single-ended data input signals, can be used. In this case, the OR gate is replaced by a fourth AND gate.

More specifically, in this embodiment, the multiple logic gates can comprise a first AND gate 651, a second AND gate 652, a third AND gate 653, a single-ended signal inverter 621, and a fourth AND gate 654. The first AND gate 651 can receive first data input signals comprising the first single-ended sampled signal 608 from the first latch 601 and the first differential clock signal 101 and can process those signals (i.e., can be adapted to process those signals, configured to process those signals, etc.) in order to output a first differential data output signal 614. At a first differential signal crossover point 612 the wires of the first differential clock signal 101 can be crossed over (i.e., swapped) in order to achieve an inverted differential clock signal 613. The second AND gate 652 can receive as second data input signals comprising the second single-ended sampled signal 609 from the second latch 602 and the inverted differential clock signal 613 and can process those signals (i.e., can be adapted to process those signals, configured to process those signals, etc.) in order to output a second differential data output signal 615. The third AND gate 653 can receive third data input signals comprising the first single-ended control signal 608 as gated by the first latch 601 and the second single-ended control signal 609 as gated by the second latch 602 and can process those signals (i.e., can be adapted to process those signals, configured to process those signals, etc.) in order to output a single-ended data output signal 616.

At a second differential signal crossover point 617 the wires of the first differential data output signal 614 can be crossed over (i.e., swapped) in order to achieve an inverted first differential data output signal 618. At a third differential signal crossover point 619 the wires of the second differential data output signal 615 can be crossed over (i.e., swapped) in order to achieve an inverted second differential data output signal 620. The single-ended signal inverter 621 can invert (i.e., can be adapted to invert, configured to invert, etc.) the single-ended data output signal 616 in order to output an inverted single-ended data output signal 622. The fourth AND gate 654 can receive fourth data input signals comprising the inverted first differential data output signal 618, the inverted second differential data output signal 620 and the inverted single-ended data output signal 622 and can process those signals (i.e., can be adapted to process those signals, configured to process those signals, etc.) in order to output a third differential data output signal 623. Finally, at a fourth differential signal crossover point 624 the wires of the third differential data output signal 623 can be crossed over (i.e., swapped) in order to achieve an inverted third differential data output signal and, more particularly, the second differential clock signal 111.

Figure 7A:
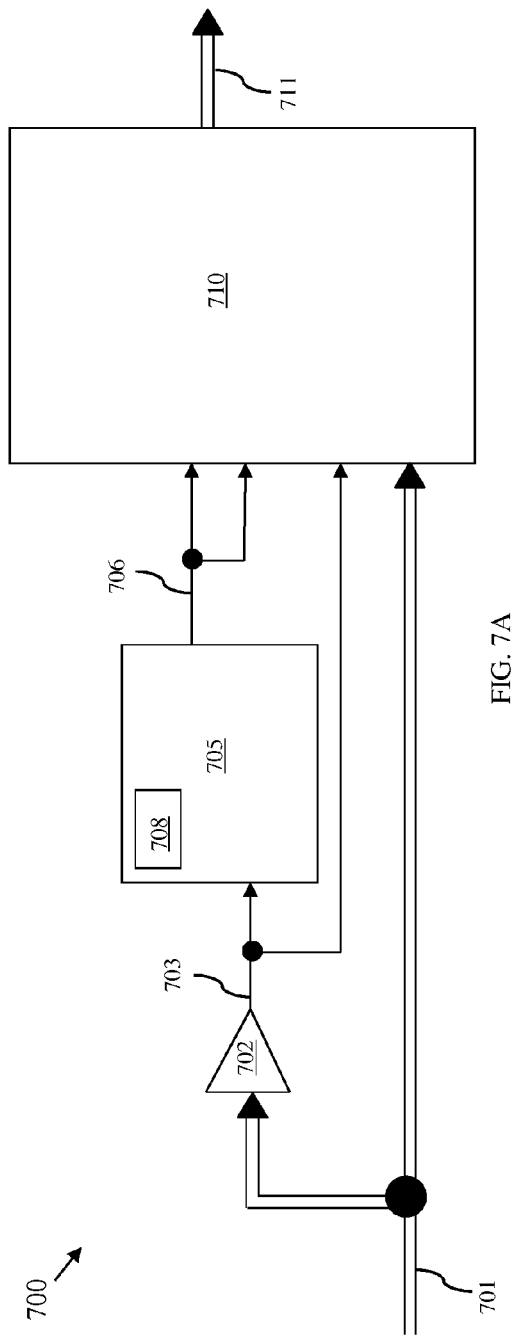
FIG. 7A is a schematic diagram illustrating embodiments of a differential clock signal generator.

Referring to FIG. 7A, also disclosed herein are embodiments of a differential clock signal generator 700 that comprises a signal converter 702, a waveform generator 705 and a deskewer 710. In each of these embodiments, the signal converter 702 can convert (i.e., can be adapted to convert, configured to convert, etc.) a first differential clock signal 701 into a single-ended clock signal 703. The waveform generator 705 can receive the single-ended clock signal 703 and can process (i.e., can be adapted to process, configured to process, programmed to process, etc.) the single-ended clock signal 703 based on a previously established and stored set 708 of signal adjustment parameters in order to output a waveform control signal 706.

More specifically, the set of signal adjustment parameters 708 can specify an optional signal frequency adjustment (e.g., frequency division) and the waveform signal generator 705 can process the single-ended clock signal 703 based on these parameters to output a single-ended waveform control signal. This single-ended waveform control signal 706 will, as discussed in greater detail below, be subsequently processed by the deskewer 710 in order to output a second differential clock signal 711 and achieve a signal delay, which is fixed as a function of the deskewer 710 structure, and any desired frequency adjustment (e.g., frequency division).

The waveform generator 705 can comprise, for example, a waveform generator, such as that described in detail in U.S. Pat. No. 6,507,230 incorporated by reference above. Those skilled in the art will recognize that a waveform generator can comprise, for example, a finite state machine configured to output waveform signal.

The deskewer 710 can receive the first differential clock signal 701, the single-ended clock signal 703, and the waveform control signal 706 and, based on all of these signals 701, 703, and 706, can output a second differential clock signal 711 that is different from, but essentially synchronously timed with, the first differential clock signal 701. That is, the deskewer 710 can process these signals 701, 703, and 706 such that the second differential clock signal 711 will be delayed with respect to the first differential clock signal 101 and will further, optionally, have a different frequency than the first differential clock signal 101.

For example, the deskewer 710 can process these signals 701, 703, and 706 such that the first differential clock signal 701 has a first frequency and the second differential clock signal 711 has a second frequency that is equal to the first frequency divided by n, where n is a number, as specified in the set of signal adjustment parameters 708. This number n can, for example, be 1, when the signal adjustment required is a signal delay and not a frequency adjustment. Alternatively, this number n can, for example, 1.5 be 2, 2.5, 3, 3.5, 4, 4.5, and so on, when the frequency adjustment required is frequency division. Alternatively, more complex formulas can be used when the desired frequency adjustment is more complex (e.g., when the frequency level of the second differential clock signal 711 is required to alternate over time).

Furthermore, the deskewer 710 can process these signals such that even though the first and second differential clock signals 701 and 711 are different in terms of delay and, optionally, frequency, the second differential clock signal 711 has edges (e.g., rising or falling edges) that are essentially synchronously timed with (i.e., essentially coincident with) edges of the first differential clock signal 701. In other words, the deskewer 710 can process these signals 701, 703, and 706 such that every one of the edges, rising and falling, of the second differential clock signal 711, which is output by the deskewer 710, is coincident with some edge, rising or falling, of the first differential clock signal 701.

Figure 7B:
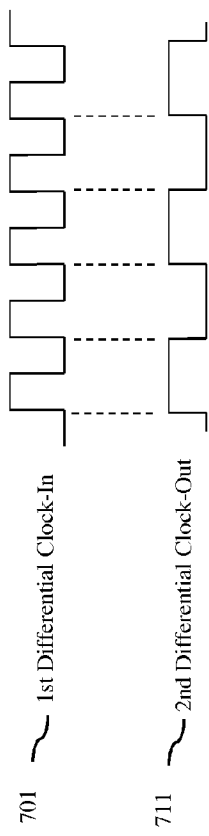
FIG. 7B is a timing diagram illustrating an exemplary differential clock signal input into the differential clock signal generator of FIG. 7A and an exemplary differential clock signal output from the differential clock signal generator of FIG. 7A.

For example, as illustrated in the timing diagram of FIG. 7B, if the signal adjustment parameters provide for a divide-by-2 function such that the frequency of the second differential clock signal 711 is one-half that of the first differential clock signal 701, then every edge, rising and falling, of the second differential clock signal 711 may be essentially synchronously time with (i.e., will occur coincident with) every other edge (e.g., every rising edge) of the first differential clock signal 701.

Figure 8:
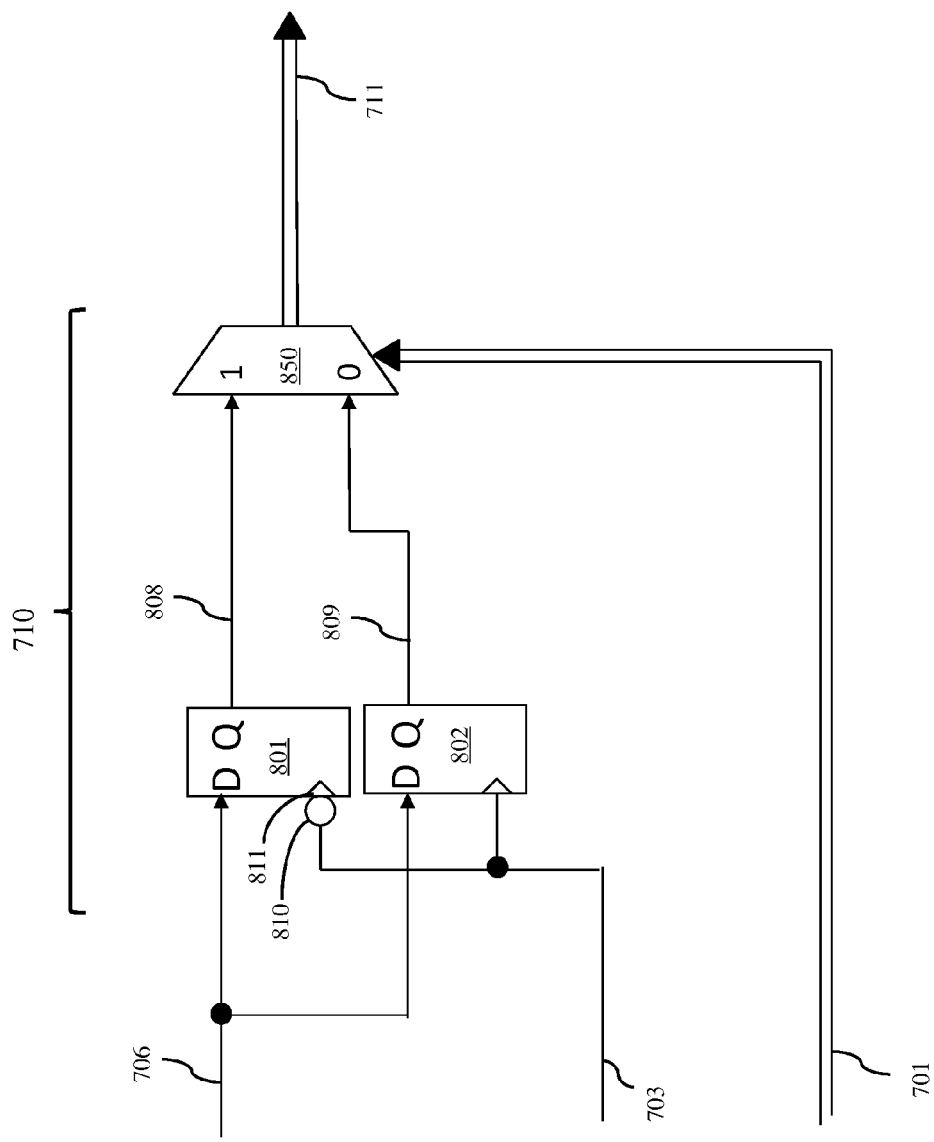
FIG. 8 is a schematic diagram illustrating an exemplary deskewer that can be incorporated into the differential clock signal generator of FIG. 7A.

Referring to FIG. 8, in one embodiment the deskewer 710 of the differential clock signal generator 700 of FIG. 7A can comprise a single-ended signal inverter 810, a pair of latches (i.e., a first latch 801 and a second latch 802) and a single multiplexer 850.

In this embodiment, the single-ended signal inverter 810 can receive and can invert (i.e., can be adapted to invert, configured to invert, etc.) the single-ended clock signal 703 in order to output an inverted single-ended clock signal 811.

The latches 801, 802 can each comprise, for example, D-latches (also referred to herein as edge triggered latches). The first latch 801 can sample the single-ended waveform control signal 706, which functions as the data input signal for this latch 801, by the inverted single-ended clock signal 811, which functions as the clock signal for this latch 801, in order to output a first single-ended sampled signal 808. The second latch 802 can sample the same single-ended waveform control signal 706, which functions as the data input signal for this latch 802, by the single-ended clock signal 703, which functions as the clock signal for this latch 802, in order to output a second single-ended sampled signal 809.

Finally, the single multiplexer 850 can comprise a two single-ended input multiplexer with a differential select. Specifically, the single multiplexer 850 can receive a select signal comprising the first differential clock signal 701, can receive single-ended data input signals comprising the first single-ended sampled signal 808 from the first latch 801 and the second single-ended sampled signal 809 from the second latch 802, and can process theses signals (i.e., can be adapted to process these signals, configured to process these signals, etc.) in order to output a differential data output signal and, more particularly, to the second differential clock signal 711.

Figure 9:
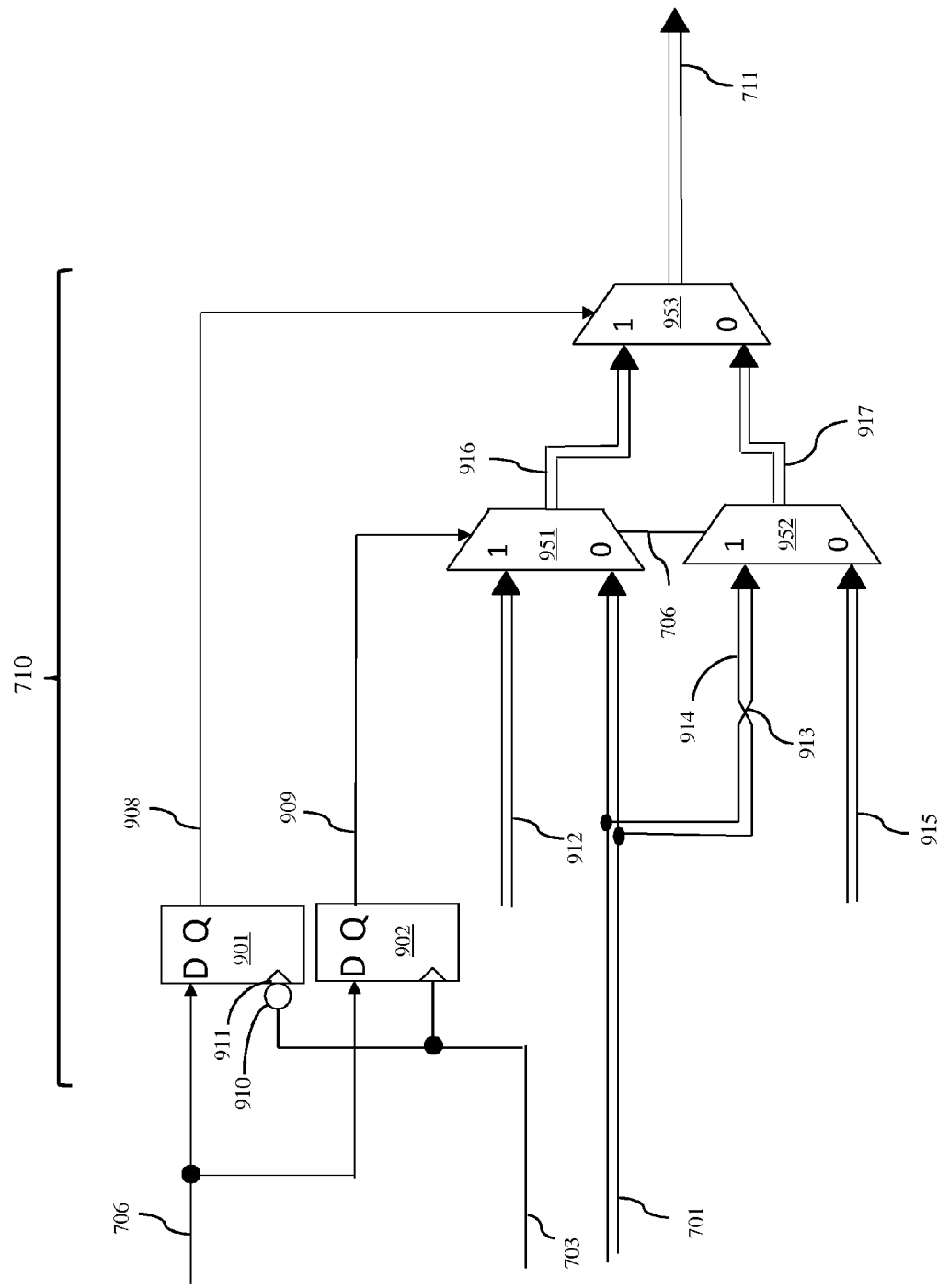
FIG. 9 is a schematic diagram illustrating another exemplary deskewer that can be incorporated into the differential clock signal generator of FIG. 7A.

Referring to FIG. 9, in another embodiment the deskewer 710 of the differential clock signal generator 700 of FIG. 7A can comprise a single-ended signal inverter 910, a pair of latches (e.g., a first latch 901 and a second latch 902) and multiple multiplexers 951-953. In this embodiment, like the previously described embodiment, the single-ended signal inverter 910 can invert the single-ended clock signal 703 in order to output an inverted single-ended clock signal 911. Additionally, the latches 901, 902 can each comprise, for example, D-latches (also referred to herein as triggered latches). The first latch 901 can sample the single-ended waveform control signal 706, which functions as the data input signal for this latch 901, by the inverted single-ended clock signal 911, which functions as the clock signal for this latch 901, in order to output a first single-ended sampled signal 908. The second latch 902 can sample the same single-ended waveform control signal 706, which functions as the data input signal for this latch 902, by the single-ended clock signal 703, which functions as the clock signal for this latch 902, in order to output a second single-ended sampled signal 909. However, instead of a single multiplexer with the single-ended sampled signals as data input signals and the first differential clock signal as a select signal, in this embodiment, multiple multiplexers 951-953, which have differential data input and output signals and single-ended select signals, can be used.

Specifically, the multiple multiplexers can comprise a first multiplexer 951 and a second multiplexer 952 connected in parallel to a third multiplexer 953. The first multiplexer 951 and the second multiplexer 952 can each receive second single-ended sampled signal 909 from the second latch 902 as their select signals (i.e., as a first select signal for the first multiplexer 951 and as a second select signal for the second multiplexer 952) and the third multiplexer 953 can receive the first single-ended sampled signal 908 from the first latch 901 as its select signal (i.e., as a third select signal). Additionally, the first multiplexer 951 can receive a differential high reference signal 912 and the first differential clock signal 701 as its first differential data input signals and can process those signals (i.e., can be adapted to process those signals, configured to process those signals, etc.) in order to output a first differential data output signal 916. The differential high reference signal 912 will be tied high.

At a differential signal crossover point 913 the wires of the first differential clock signal 701 can be crossed over (i.e., swapped) in order to achieve an inverted differential clock signal 914. The second multiplexer 951 can receive second differential data input signals comprising the inverted differential clock signal 914 and a differential low reference signal 915 and can process those signals (i.e., can be adapted to process those signals, configured to process those signals, etc.) in order to output a second differential data output signal 917. The differential low reference signal 912 will be tied low.

Finally, the third multiplexer 953 can receive third differential data input signals comprising the first differential data output signal 916 from the first multiplexer 951 and the second differential data output signal 917 from the second multiplexer 952 and can process those signals (i.e., can be adapted to process those signals, configured to process those signals, etc.) in order to output a third differential data output signal and, more particularly, the second differential clock signal 711.

Figure 10:
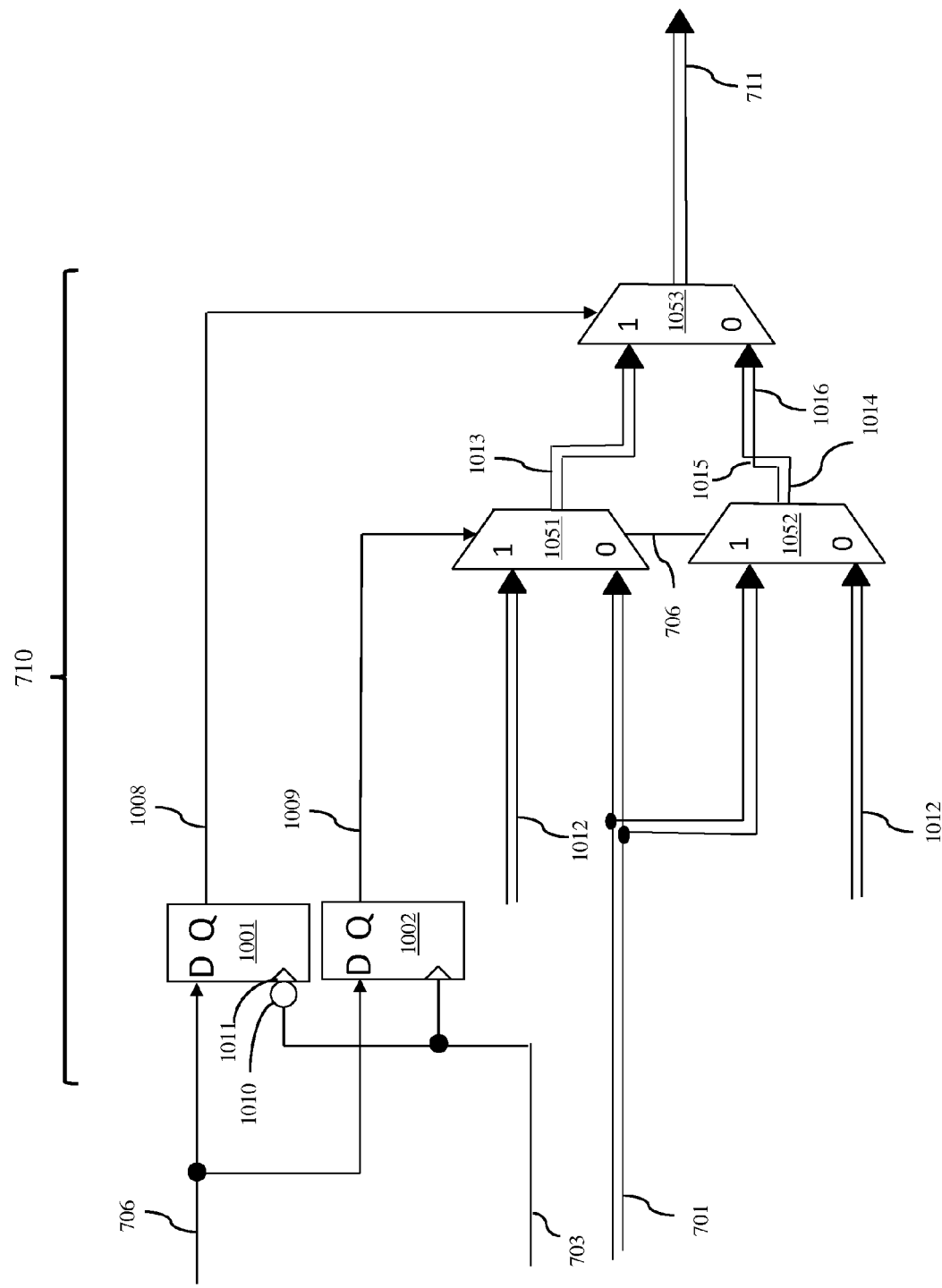
FIG. 10 is a schematic diagram illustrating yet another exemplary deskewer that can be incorporated into the differential clock signal generator of FIG. 7A.

Referring to FIG. 10, in another embodiment the deskewer 710 of the differential clock signal generator 700 of FIG. 7A can comprise a single-ended signal inverter 1010, a pair of latches (e.g., a first latch 1001 and a second latch 1002) and multiple multiplexers 1051-1053. In this embodiment, like the previously described embodiments, the single-ended signal inverter 1010 can invert the single-ended clock signal 703 in order to output an inverted single-ended clock signal 1011. Additionally, the latches 1001, 1002 can each comprise, for example, D-latches (also referred to herein as edge triggered latches). The first latch 1001 can sample the single-ended waveform control signal 706, which functions as the data input signal for this latch 1001, by the inverted single-ended clock signal 1011, which functions as the clock signal for this latch 1001, in order to output a first single-ended sampled signal 1008. The second latch 1002 can sample the same single-ended waveform control signal 706, which functions as the data input signal for this latch 1002, by the single-ended clock signal 703, which functions as the clock signal for this latch 1002, in order to output a second single-ended sampled signal 1009. Again, instead of a single multiplexer with the single-ended sampled signals as data input signals and the first differential clock signal as a select signal, in this embodiment, multiple multiplexers 1051-1053, which have differential data input and output signals and single-ended select signals, can be used.

In this case, the multiple multiplexers can comprise a first multiplexer 1051 and a second multiplexer 1052 connected in parallel to a third multiplexer 1053. The first multiplexer 1051 and the second multiplexer 1052 can each receive the second single-ended sampled signal 1009 from the second latch 1002 as their select signals (i.e., as a first select signal for the first multiplexer 1051 and a second select signal for the second multiplexer 1052) and the third multiplexer 1053 can receive the first single-ended sampled signal 1008 from the first latch 1001 as its third select signal. Additionally, the first multiplexer 1051 can receive first differential data input signals comprising a differential high reference signal 1012 and the first differential clock signal 701 and can process those signals (i.e., can be adapted to process those signals, can be configured to process those signals, etc.) in order to output a first differential data output signal 1013. The differential high reference signal 1012 will be tied high.

The second multiplexer 1052 can similarly receive second differential data input signals comprising the first differential clock signal 701 and the differential high reference signal 1012 and can process those signals (i.e., can be adapted to process those signals, configured to process those signals, etc.) in order to output a second differential data output signal 1014. At a differential signal crossover point 1015 the wires of the second differential data output signal 1014 can be crossed over (i.e., swapped) in order to output an inverted second differential data output signal 1016.

Finally, the third multiplexer 1053 can receive third differential data input signals comprising the first differential data output signal 1013 from the first multiplexer 1051 and the inverted second differential data output signal 1016 from the differential signal crossover point 1015 and can process those signals (i.e., can be adapted to process those signals, configured to process those signals, etc.) in order to output a third differential data output signal and, more particularly, the second differential clock signal 711.

Figure 11:
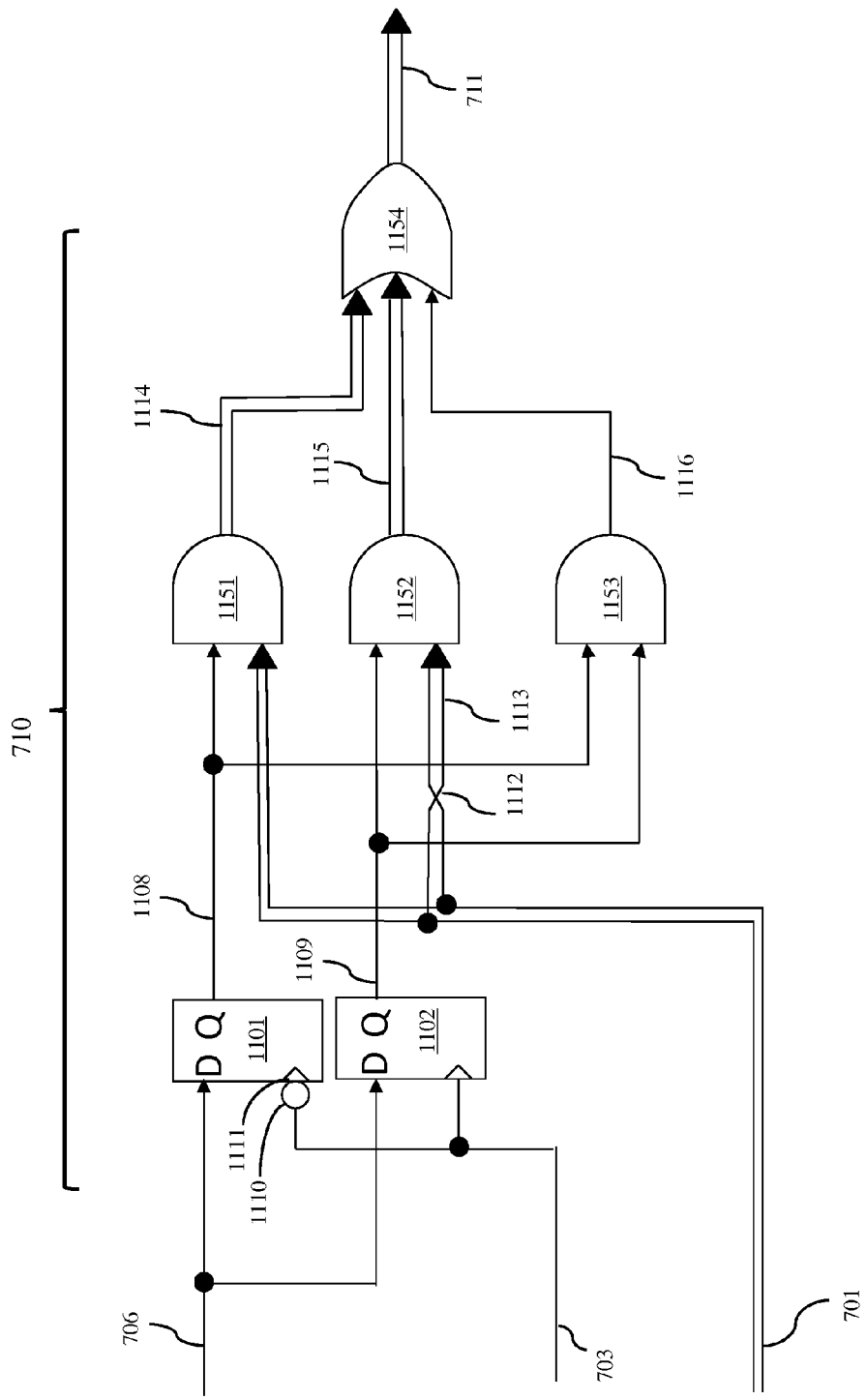
FIG. 11 is a schematic diagram illustrating yet another exemplary deskewer that can be incorporated into the differential clock signal generator of FIG. 7A.

Referring to FIG. 11, in yet another embodiment the deskewer 710 of the differential clock signal generator 700 of FIG. 7A can comprise a single-ended signal inverter 1110, a pair of latches (e.g., a first latch 1101 and a second latch 1102) and multiple logic gates. In this embodiment, like the previously described embodiments, the single-ended signal inverter 1110 can invert the single-ended clock signal 703 in order to output an inverted single-ended clock signal 1111. Additionally, the latches 1101, 1102 can each comprise, for example, D-latches (also referred to herein as edge triggered latches). The first latch 1101 can sample the single-ended waveform control signal 706, which functions as the data input signal for this latch 1101, by the inverted single-ended clock signal 1111, which functions as the clock signal for this latch 1101, in order to output a first single-ended sampled signal 1108. The second latch 1102 can sample the same single-ended waveform control signal 706, which functions as the data input signal for this latch 1102, by the single-ended clock signal 703, which functions as the clock signal for this latch 1102, in order to output a second single-ended sampled signal 1109. However, instead of multiplexer(s), multiple gates, which receive a combination of differential and single-ended data input signals, can be used. These multiple logic gates can comprise at least three AND gates, and an OR gate to which the three AND gates are electrically connected in parallel.

Specifically, the multiple logic gates can comprise a first AND gate 1151, a second AND gate 1152, a third AND gate 1153 and an OR gate 1154. The first AND gate 1151 can receive as first data input signals comprising the first single-ended sampled signal 1108 from the first latch 1101 and the first differential clock signal 701 and can process those signals (i.e., can be adapted to process those signals, can be configured to process those signals, etc.) in order to output a first differential data output signal 1114. At a differential signal crossover point 1112 the wires of the first differential clock signal 701 can be crossed over (i.e., swapped) in order to achieve an inverted differential clock signal 1113. The second AND gate 1152 can receive second data input signals comprising the second single-ended sampled signal 1109 from the second latch 1102 and the inverted differential clock signal 1113 and can process those signals (i.e., can be adapted to process those signals, configured to process those signals, etc.) in order to output a second differential data output signal 1115. The third AND gate 1153 can receive third data input signals comprising the first single-ended sampled signal 1108 from the first latch 1101 and the second single-ended sampled signal 1109 from the second latch 1102 and can process those signals (i.e., can be adapted to process those signals, configured to process those signals, etc.) in order to output a single-ended data output signal 1116. The OR gate 1154 can receive fourth data input signals comprising the first differential data output signal 1114 from the first AND gate 1151, the second differential data output signal 1115 from the second AND gate 1152 and the single-ended data output signal 1116 from the third AND gate 1153 and can process those signals (i.e., can be adapted to process those signals, configured to process those signals, etc.) in order to output a third differential data output signal and, more particularly, the second differential clock signal 711.

Figure 12:
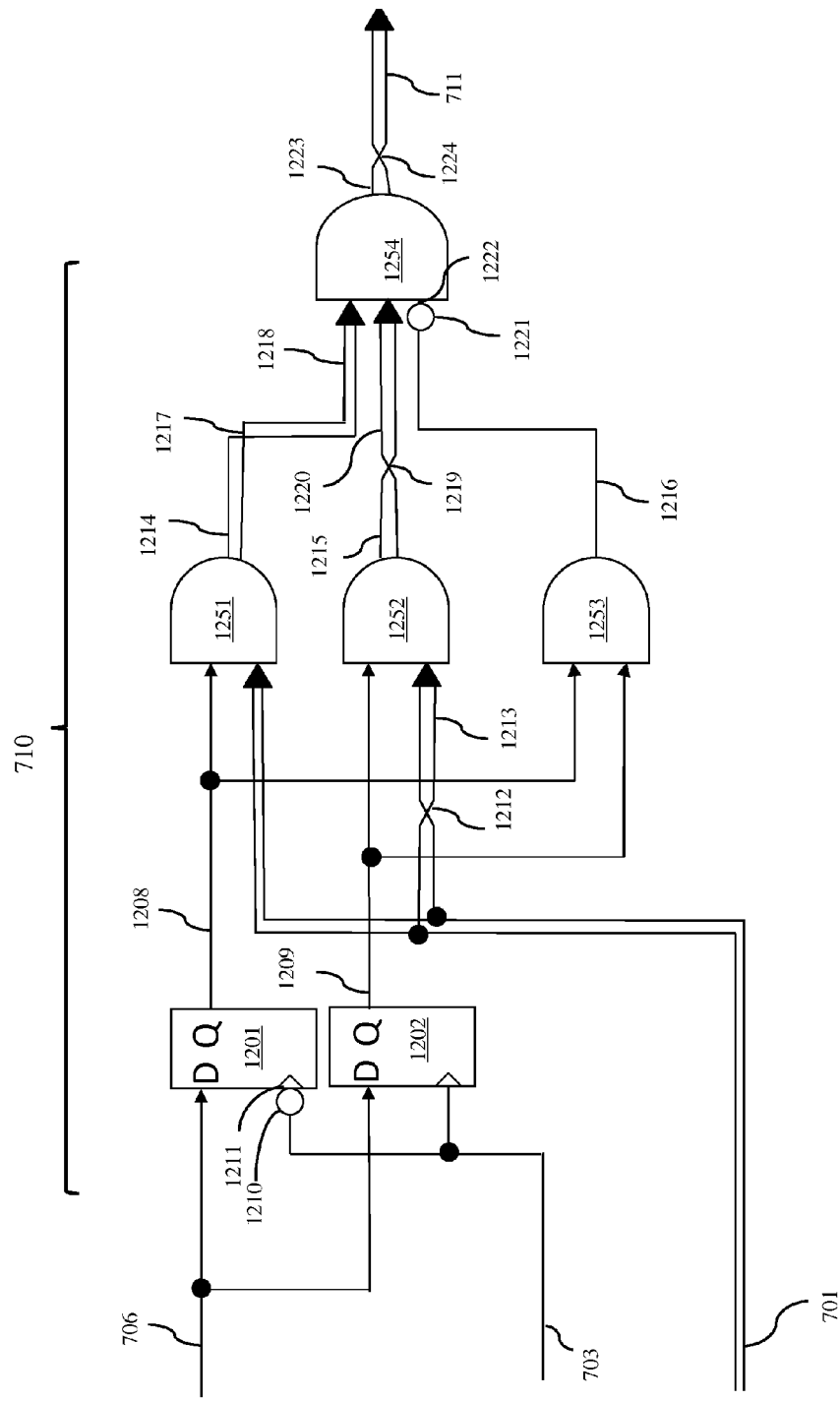
FIG. 12 is a schematic diagram illustrating yet another exemplary deskewer that can be incorporated into the differential clock signal generator of FIG. 7A.

Referring to FIG. 12, in yet another embodiment the deskewer 710 of the differential clock signal generator 700 of FIG. 7A can comprise a single-ended signal inverter 1210, a pair of latches (e.g., a first latch 1201 and a second latch 1202) and multiple logic gates. In this embodiment, like the previously described embodiments, the single-ended signal inverter 1210 can invert the single-ended clock signal 703 in order to output an inverted single-ended clock signal 1211. Additionally, the latches 1201, 1202 can each comprise, for example, D-latches (also referred to herein as edge triggered latches). The first latch 1201 can sample the single-ended waveform control signal 706, which functions as the data input signal for this latch 1201, by the inverted single-ended clock signal 1211, which functions as the clock signal for this latch 1201, in order to output a first single-ended sampled signal 1208. The second latch 1202 can sample the same single-ended control signal 706, which functions as the data input signal for this latch 1202, by the single-ended clock signal 703, which functions as the clock signal for this latch 1202, in order to output a second single-ended sampled signal 1209. However, instead of multiplexer(s), multiple gates, which receive a combination of differential and single-ended data input signals, can be used. In this case, the OR gate is replaced by a fourth AND gate.

More specifically, in this embodiment, the multiple logic gates can comprise a first AND gate 1251, a second AND gate 1252, a third AND gate 1253, a single-ended signal inverter 1221, and a fourth AND gate 1254. The first AND gate 1251 can receive first data input signals comprising the first single-ended sampled signal 1208 from the first latch 1201 and the first differential clock signal 701 and can process those signals (i.e., can be adapted to process those signals, configured to process those signals, etc.) in order to output a first differential data output signal 1214. At a first differential signal crossover point 1212 the wires of the first differential clock signal 701 can be crossed over (i.e., swapped) in order to achieve an inverted differential clock signal 1213. The second AND gate 1252 can receive second data input signals comprising the second single-ended sampled signal 1209 from the second latch 1202 and the inverted differential clock signal 1213 and can process those signals (i.e., can be adapted to process those signals, configured to process those signals, etc.) in order to output a second differential data output signal 1215. The third AND gate 1253 can receive third data input signals comprising the first single-ended sampled signal 1208 from the first latch 1201 and the second single-ended sampled signal 1209 from the second latch 1202 and can process those signals (i.e., can be adapted to process those signals, configured to process those signals, etc.) in order to output a single-ended data output signal 1216.

At a second differential signal crossover point 1217 the wires of the first differential data output signal 1214 can be crossed over (i.e., swapped) in order to achieve an inverted first differential data output signal 1218. At a third differential signal crossover point 1219 the wires of the second differential data output signal 1215 can be crossed over (i.e., swapped) in order to achieve an inverted second differential data output signal 1220. The single-ended signal inverter 1221 can invert (i.e., can be adapted to invert, configured to invert, etc.) the single-ended data output signal 1216 in order to output an inverted single-ended data output signal 1222. The fourth AND gate 1254 can receive fourth data input signals comprising the inverted first differential data output signal 1218, the inverted second differential data output signal 220 and the inverted single-ended data output signal 1222 and can process those signals (i.e., can be adapted to process those signals, configured to process those signals, etc.) in order to output a third differential data output signal 1223. Finally, at a fourth differential signal crossover point 1224 the wires of the third differential data output signal 1223 can be crossed over (i.e., swapped) in order to achieve an inverted third differential data output signal and, more particularly, the second differential clock signal 711.

It should be noted that in the differential clock signal generator 700 described above and illustrated in FIG. 7A the single-ended waveform control signal 706 output from the waveform generator 705 should be generated so as to meet the half duty cycle set up and hold requirements for the D-latches in the deskewer 710. Those skilled in the art will recognize that this can be accomplished using, for example, pipelining registers if necessary.

It should further be understood that the terminology used herein is for the purpose of describing particular embodiments only and is not intended to be limiting. As used herein the phrase "tied high" with respect to a differential signal refers to a differential signal where the true wire is electrically connected to a high reference voltage ($V_{ref\ high}$) and the complement wire is electrically connected to a low reference voltage ($V_{ref\ low}$) (e.g., ground). Similarly, as used herein the phrase "tied low" with respect to a differential signal refers to a differential signal where the true wire is electrically connected to a low reference voltage ($V_{ref\ low}$) (e.g., ground) and the complement wire is electrically connected to a high reference voltage ($V_{ref\ high}$). As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the disclosed embodiments has been presented for purposes of illustration and is not intended to be exhaustive. Many modifications and variations will be apparent to those of ordinary skill in the art without departing from the scope and spirit of the disclosed embodiments.

Therefore, disclosed above are embodiments of a differential clock signal generator which processes a first differential clock signal using a combination of both differential and non-differential components to generate a second differential clock signal. Specifically, a signal converter converts the first differential clock signal into a single-ended clock signal. The single-ended clock signal is used either by a finite state machine to generate two single-ended control signals or by a waveform generator to generate a single-ended waveform control signal. In any case, a deskewer, which comprises a pair of single-ended latches and either multiplexer(s) or logic gates, receives and processes the first differential clock signal, the single-ended clock signal, and the control signal(s) in order to output a second differential clock signal that is different from the first differential clock signal (e.g., in terms of delay and, optionally, frequency), but synchronously linked to the first differential clock signal (i.e., the rising and falling edges of the second differential clock signal will occur coincident with rising and/or falling edges of the first differential clock signal). Since the path from the first differential clock signal to the second differential clock signal is entirely within the differential domain, the resulting second differential clock signal is less susceptible to noise and power variation. Additionally, there is less uncertainty with regard to the second differential clock signal because the clock latency is smaller.

What is claimed is:

1. A differential clock signal generator comprising:
    a signal converter converting a first differential clock signal into a single-ended clock signal;
    a finite state machine receiving said single-ended clock signal and, based on said single-ended clock signal and a set of signal adjustment parameters, outputting two single-ended control signals; and
    a deskewer receiving said first differential clock signal, said single-ended clock signal, and said two single-ended control signals and, based on said first differential clock signal, said single-ended clock signal, and said two single-ended control signals, outputting a second differential clock signal.

2. The differential clock signal generator of claim 1, said second differential clock signal and said first differential clock signal having edges that coincidently occur.

3. The differential clock signal generator of claim 1, said first differential clock signal and said second differential clock signal having different frequencies.

4. The differential clock signal generator of claim 1, said deskewer comprising at least the following:
    a single-ended signal inverter inverting said single-ended clock signal and outputting an inverted single-ended clock signal;
    a first latch sampling a first single-ended control signal by said inverted single-ended clock signal in order to output a first single-ended sampled signal;
    a second latch sampling a second single-ended control signal by said single-ended clock signal in order to output a second single-ended sampled signal; and
    a single multiplexer receiving a select signal comprising said first differential clock signal as a select signal, receiving single-ended data input signals comprising said first sampled signal from said first latch and said second sampled signal from said second latch, and outputting a differential data output signal comprising said second differential clock signal.

5. A differential clock signal generator comprising:
a signal converter converting a first differential clock signal into a single-ended clock signal;
a finite state machine receiving said single-ended clock signal and, based on said single-ended clock signal and a set of signal adjustment parameters, outputting two single-ended control signals comprising a first single-ended control signal and a second single-ended control signal; and
a deskewer receiving said first differential clock signal, said single-ended clock signal, and said two single-ended control signals and, based on said first differential clock signal, said single-ended clock signal, and said two single-ended control signals, outputting a second differential clock signal, said deskewer comprising:
    a single-ended signal inverter inverting said single-ended clock signal and outputting an inverted single-ended clock signal;
    a first latch sampling said first single-ended control signal by said inverted single-ended clock signal in order to output a first single-ended sampled signal;
    a second latch sampling said second single-ended control signal by said single-ended clock signal in order to output a second single-ended sampled signal; and
    multiple multiplexers having differential data input and output signals and single-ended select signals, said multiple multiplexers comprising a first multiplexer and a second multiplexer connected in parallel to a third multiplexer,
        said first multiplexer receiving a data input signal comprising said first differential clock signal and receiving a first select signal comprising said second sampled signal from said second latch,
        said second multiplexer receiving a second select signal comprising said second sampled signal from said second latch, and
        said third multiplexer receiving a third select signal comprising said first sampled signal from said first latch.

6. The differential clock signal generator of claim 5, said second differential clock signal and said first differentially clock signal having edges that coincidently occur.

7. The differential clock signal generator of claim 5, said first differential clock signal and said second differential clock signal having different frequencies.

8. The differential clock signal generator of claim 5, said deskewer further comprising a differential signal crossover point for inverting said first differential clock signal into an inverted differential clock signal,
said first multiplexer further receiving first differential data input signals comprising a differential high reference signal and said first differential clock signal and outputting a first differential data output signal,
said second multiplexer further receiving second differential data input signals comprising said inverted differential clock signal and a differential low reference signal and outputting a second differential data output signal, and
said third multiplexer further receiving third differential data input signals comprising said first differential data output signal and said second differential data output signal and outputting a third differential data output signal comprising said second differential clock signal.

9. The differential clock signal generator of claim 5,
said first multiplexer further receiving first differential data input signals comprising a differential high reference signal and said first differential clock signal and outputting a first differential data output signal,
said second multiplexer further receiving second differential data input signals comprising said first differential clock signal and said differential high reference signal and outputting a second differential data output signal,
said deskewer further comprising a differential signal crossover point for inverting said second differential data output signal into an inverted second differential data output signal, and
said third multiplexer further receiving third differential data input signals comprising said first differential data output signal and said inverted second differential data output signal and outputting a third differential data output signal comprising said second differential clock signal.

10. A differential clock signal generator comprising:
a signal converter converting a first differential clock signal into a single-ended clock signal;
a finite state machine receiving said single-ended clock signal and, based on said single-ended clock signal and a set of signal adjustment parameters, outputting two signal-ended control signals comprising a first single-ended control signal and a second single-ended control signal; and
a deskewer receiving said first differential clock signal, said single-ended clock signal, and said two single-ended control signals and, based on said first differential clock signal, said single-ended clock signal, and said two single-ended control signals, outputting a second differential clock signal, said deskewer comprising:
    a single-ended signal inverter inverting said single-ended clock signal and outputting an inverted single-ended clock signal;
    a first latch sampling said first single-ended control signal by said inverted single-ended clock signal in order to output a first single-ended sampled signal;
    a second latch sampling said second single-ended control signal by said single-ended clock signal in order to output a second single-ended sampled signal; and
    multiple logic gates comprising at least the following:
        a first AND gate receiving first data input signals comprising said first sampled signal from said first latch and said first differential clock signal and outputting a first differential data output signal, said first differential clock signal being inverted into an inverted differential clock signal at a differential signal crossover point for;
        a second AND gate receiving second data input signals comprising said second sampled signal from said second latch and said inverted differential clock signal and outputting a second differential data output signal;
        a third AND gate receiving third data input signals comprising said first sampled signal from said first latch and said second sampled signal from said second latch and outputting a single-ended data output signal; and
        any one of an OR gate and a fourth AND gate, said first AND gate, said second AND gate and said third AND gate being connected in parallel to said one of said OR gate and said fourth AND gate.

11. The differential clock signal generator of claim 10, said second differential clock signal and said first differentially clock signal having edges that coincidently occur.

12. The differential clock signal generator of claim 10, said first differential clock signal and said second differential clock signal having different frequencies.

13. The differential clock signal generator of claim 10, said OR gate receiving fourth data input signals comprising said first differential data output signal from said first AND gate, said second differential data output signal from said second AND gate and said single-ended data output signal from said third AND gate and outputting said second differential clock signal.

14. The differential clock signal generator of claim 10, said multiple logic gates further comprising a second single-ended inverter, said first differential data output signal being inverted into an inverted first differential data output signal at a second differential signal crossover point,
said second differential data output signal being inverted into an inverted second differential data output signal at a third differential signal crossover point,
said second single-ended inverter inverting said single-ended data output signal and outputting an inverted single-ended data output signal,
said fourth AND gate receiving fourth data input signals comprising said inverted first differential data output signal, said inverted second differential data output signal and said inverted single-ended data output signal and outputting a third differential data output signal, and
said third differential data output signal being inverted into said second differential clock signal at a fourth differential signal crossover point.

* * * * *